(12) United States Patent
Watanabe

(10) Patent No.: US 7,928,510 B2
(45) Date of Patent: Apr. 19, 2011

(54) MANUFACTURING METHOD OF SEMICONDUCTOR DEVICE

(75) Inventor: Ryosuke Watanabe, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 802 days.

(21) Appl. No.: 11/522,455

(22) Filed: Sep. 18, 2006

(65) Prior Publication Data

US 2007/0077691 A1  Apr. 5, 2007

(30) Foreign Application Priority Data

Sep. 30, 2005  (JP) ................................ 2005-288141

(51) Int. Cl.
*H01L 27/13* (2006.01)
*H01L 29/786* (2006.01)

(52) U.S. Cl. .... 257/350; 257/354; 257/642; 257/E29.27

(58) Field of Classification Search .................. 438/113, 438/458–459; 257/347, 350, 354, 642, E29.27
See application file for complete search history.

(56) References Cited

U.S. PATENT DOCUMENTS

| | | | |
|---|---|---|---|
| 5,745,825 A | 4/1998 | Okawa et al. | |
| 6,190,493 B1 * | 2/2001 | Watanabe et al. | ............. 156/300 |
| 6,438,341 B1 | 8/2002 | Matsuoka | |
| 6,646,711 B2 | 11/2003 | Sugano | |
| 2002/0067459 A1 | 6/2002 | Sugano | |
| 2004/0256618 A1 | 12/2004 | Imai et al. | |
| 2006/0273319 A1 * | 12/2006 | Dairiki et al. | ................... 257/66 |

FOREIGN PATENT DOCUMENTS

| | | |
|---|---|---|
| EP | 1 453 086 | 9/2004 |
| JP | 2002-087844 | 3/2002 |
| JP | 2003005475 A | 1/2003 |

(Continued)

OTHER PUBLICATIONS

European search report corresponding European patent application No. 06022532.3-2209 lists the references above.

(Continued)

*Primary Examiner* — Mary Wilczwski
*Assistant Examiner* — Toniae M Thomas
(74) *Attorney, Agent, or Firm* — Eric J. Robinson; Robinson Intellectual Property Law Office, P.C.

(57) ABSTRACT

It is an object of the present invention to provide a manufacturing method of a semiconductor device where a semiconductor element is prevented from being damaged and throughput speed thereof is improved, even in a case of thinning or removing a supporting substrate after forming the semiconductor element over the supporting substrate. According to one feature of the present invention, a method for manufacturing a semiconductor device includes the steps of forming a plurality of element groups over an upper surface of a substrate; forming an insulating film so as to cover the plurality of element groups; selectively forming an opening to the insulating film which is located in a region between neighboring two element groups in the plurality of element groups to expose the substrate; forming a first film so as to cover the insulating film and the opening; exposing the element groups by removing the substrate; forming a second film so as to cover the surface of the exposed element groups; and cutting off between the plurality of element groups so as not to expose the insulating film.

12 Claims, 16 Drawing Sheets

FOREIGN PATENT DOCUMENTS

| | | |
|---|---|---|
| JP | 2004183860 A | 7/2004 |
| JP | 2004246374 A | 9/2004 |
| WO | WO 2005/057658 A1 * | 6/2005 |
| WO | WO 2005/076358 | 8/2005 |
| WO | WO 2006/006611 | 1/2006 |

OTHER PUBLICATIONS

International Search Report (Application No. PCT/JP2006/318442) dated Dec. 19, 2006.
Written Opinion (Application No. PCT/JP2006/318442) dated Dec. 19, 2006.
* cited by examiner

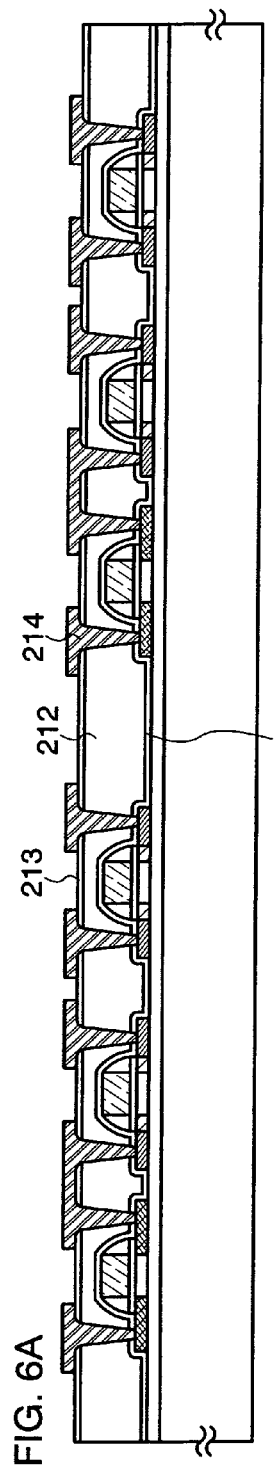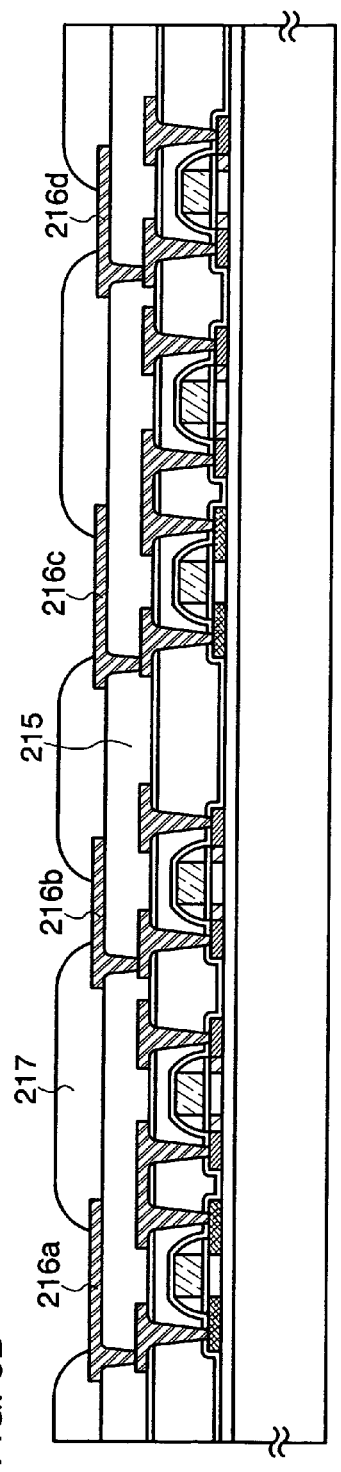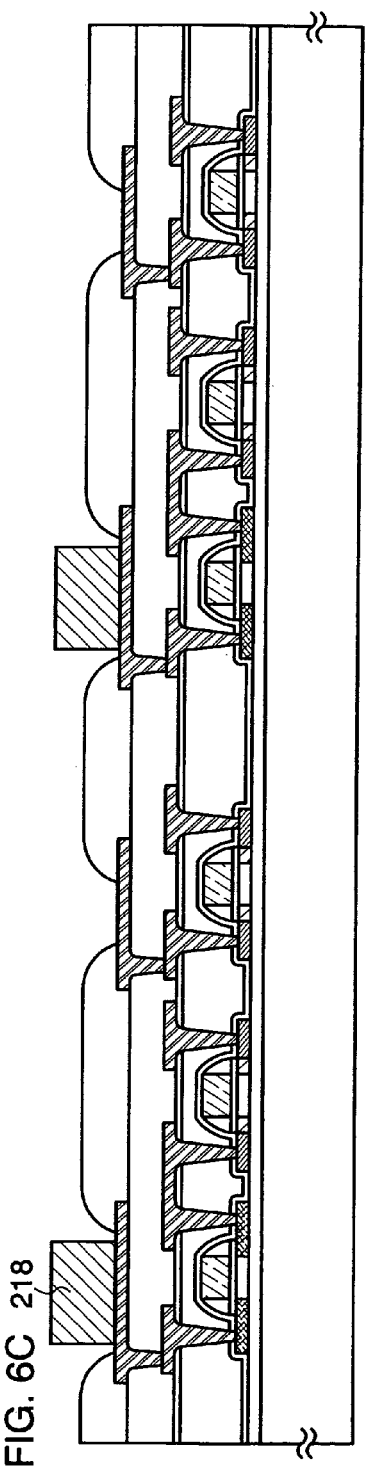

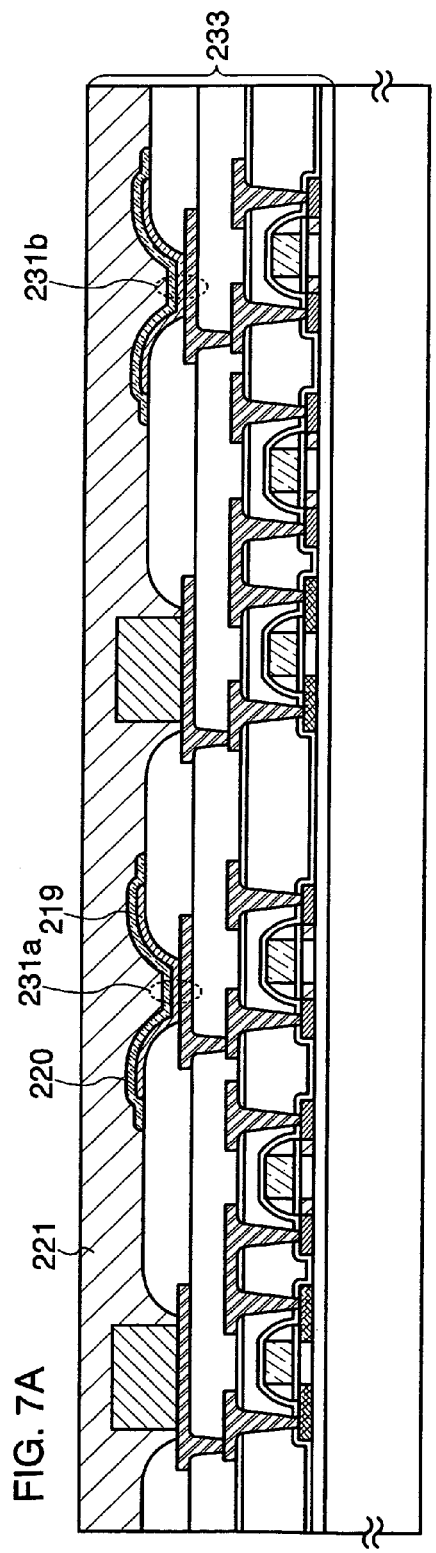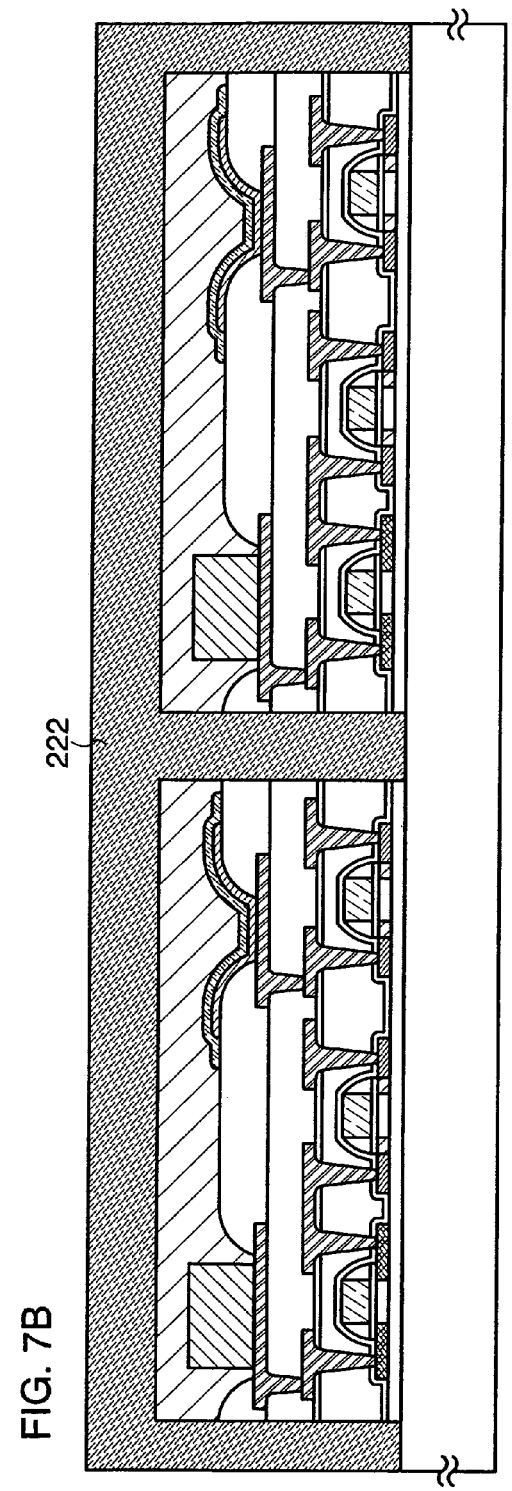
FIG. 7A
FIG. 7B

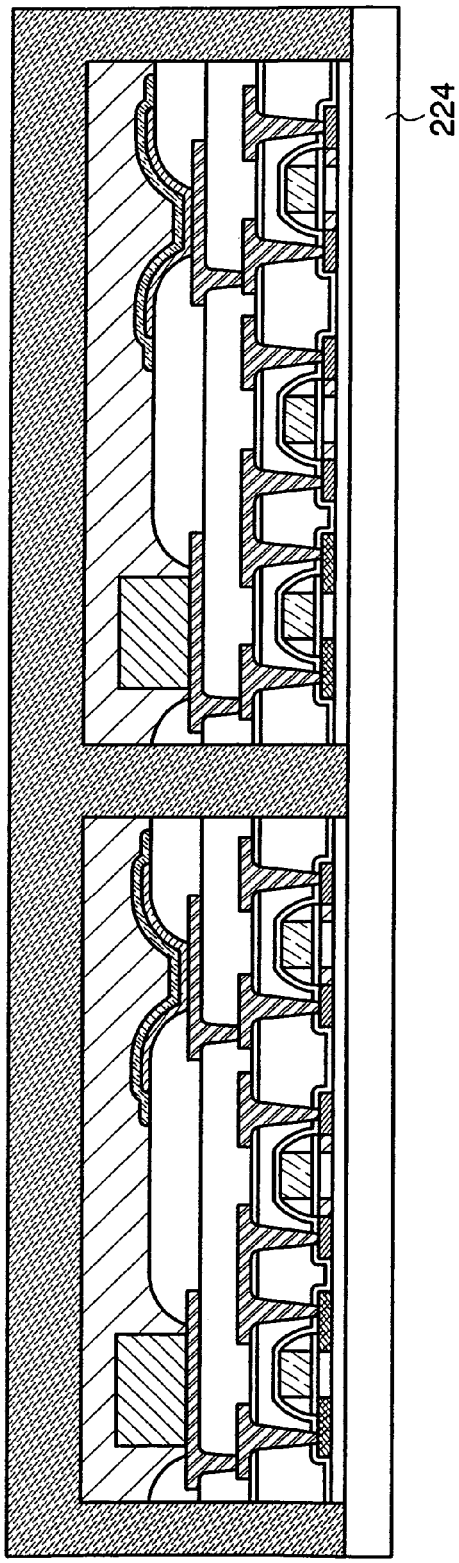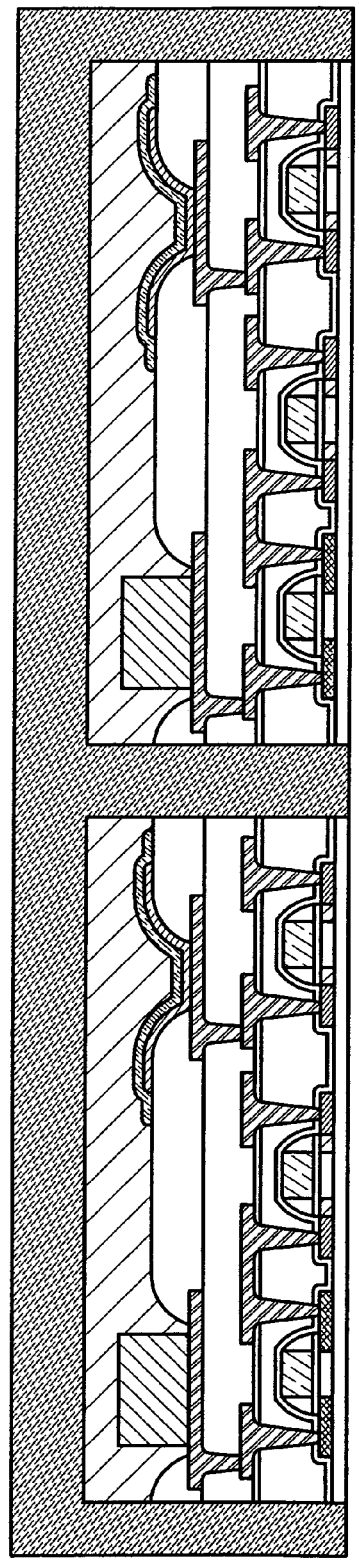

322　321

322　323　321

321　322　323

322　323
321

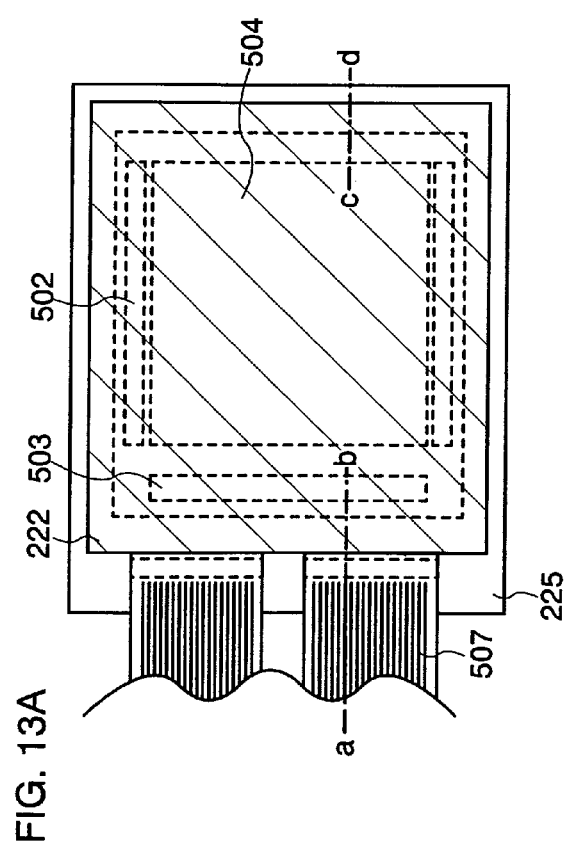
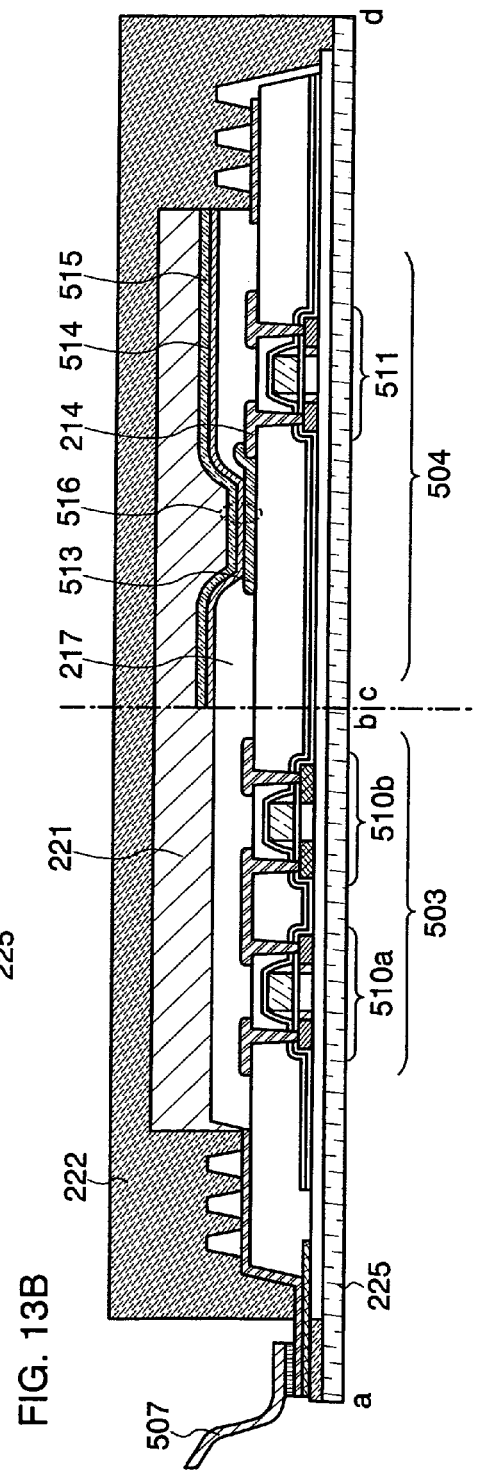
FIG. 13A
FIG. 13B

MANUFACTURING METHOD OF SEMICONDUCTOR DEVICE

TECHNICAL FIELD

The present invention relates to a manufacturing method of a semiconductor device, in particular, to a manufacturing method of a semiconductor device where a supporting substrate is removed after forming a semiconductor element such as transistor over the supporting substrate.

BACKGROUND ART

In recent years, by forming a semiconductor element over a rigid substrate such as a glass substrate, a semiconductor device has been actively developed for use in a display such as an LCD or an organic EL display, a photoelectric conversion element such as a photo sensor or a solar cell, or the like. Besides, a semiconductor device which transmits and receives data without contact (also referred to as an RFID (Radio Frequency Identification) tag, an ID tag, an IC tag, an IC chip, a wireless tag, an electronic tag, or a wireless chip) has been actively developed. In addition, recently, a flexible device such as a film-state display or a semiconductor device embedded in paper has been required, and a reduction in thickness holds an important clue.

In order to reduce thickness of a semiconductor device, there is a method for using a substrate which is thinned in advance, for example. However, in this case, warpage or the like of the substrate, or, in dealing with the element, warpage due to stress, difficulty in handling, misalignment in lithography or a printing step, and the like become problems. Therefore, a method for thinning or removing a substrate after forming a semiconductor element over the substrate is generally used.

As a method for thinning or removing a substrate, for example, there is a technique for removing a supporting substrate (a glass substrate) by grinding treatment or polishing treatment, or wet etching using a chemical reaction (for example, see Reference 1: Japanese Published Patent Application No. 2002-87844).

DISCLOSURE OF INVENTION

However, in a case of removing a substrate, over which a semiconductor element is formed, by grinding treatment or polishing treatment, there is a limit of thinning a film due to a limit of accuracy of a device and in-plane uniformity of polishing; therefore, it has been difficult to make the entire surface have thickness of 50 µm or less; thus, it has been difficult to remove the substrate. In addition, when a substrate is subjected to grinding treatment and polishing treatment, a semiconductor element provided over the substrate is stressed, thereby having fear of damaging the semiconductor element. This is because the semiconductor element is stressed more significantly as the substrate becomes thinner; therefore, it has been difficult to remove the substrate by grinding treatment or polishing treatment.

In addition, in a case of removing the substrate, over which the semiconductor element is formed, by chemical treatment, it is extremely difficult to remove only the substrate with high yields and uniformly; thus, there has been a problem that it takes up much time to perform the treatment.

In view of the above problems, it is an object of the present invention to provide a manufacturing method of a semiconductor device where a semiconductor element is prevented from being damaged and throughput speed thereof is improved, even in a case of thinning or removing a supporting substrate after forming the semiconductor element over the supporting substrate.

According to one feature of the present invention, a method for manufacturing a semiconductor device includes the steps of forming a plurality of element groups over an upper surface of a substrate; forming an insulating film so as to cover the plurality of element groups; selectively forming an opening to the insulating film which is located in a region between neighboring two element groups in the plurality of element groups to expose the substrate; forming a first film so as to cover the insulating film and the opening; exposing the element groups by removing the substrate; forming a second film so as to cover the surface of the exposed element groups; and cutting off between the plurality of element groups so as not to expose the insulating film.

According to another feature of the present invention, a method for manufacturing a semiconductor device includes the steps of forming a base film over an upper surface of a substrate; forming a plurality of element groups over the base film; forming an insulating film so as to cover the plurality of element groups; selectively forming an opening to the insulating film which is located in a region between neighboring two element groups in the plurality of element groups to expose the substrate or the base film; forming a first film so as to cover the insulating film and the opening; exposing the base film by removing the substrate; forming a second film so as to cover the surface of the exposed base film; and cutting off between the plurality of element groups so as not to expose the insulating film.

According to another feature of the present invention, in a method for manufacturing a semiconductor device in the above structures, a substrate is removed by being thinned from the other side and then removing the thinned substrate by chemical treatment using chemical reaction (chemical reaction treatment (hereinafter, also simply referred to as chemical treatment)). Note that a substrate can be thinned using a physical means, or a physical means with a chemical means, and for example, either grinding treatment or polishing treatment, or both can be used. Chemical treatment can be performed by dipping a thinned substrate into a chemical solution and generating chemical reaction to the thinned substrate.

Even in a case of removing a substrate over which a semiconductor element is formed, the semiconductor element is prevented from being damaged according to the present invention. Consequently, throughput speed of a semiconductor device can be improved.

BRIEF DESCRIPTION OF DRAWINGS

In the accompanying drawings:

FIGS. 6A to 6C are views each showing an example of a manufacturing method of a semiconductor device of the present invention;

FIGS. 7A and 7B are views each showing an example of a manufacturing method of a semiconductor device of the present invention;

FIGS. 8A and 8B are views each showing an example of a manufacturing method of a semiconductor device of the present invention;

FIGS. 13A and 13B are views each showing an example of an application mode of a semiconductor device of the present invention;

BEST MODE FOR CARRYING OUT THE INVENTION

Figure 1A:
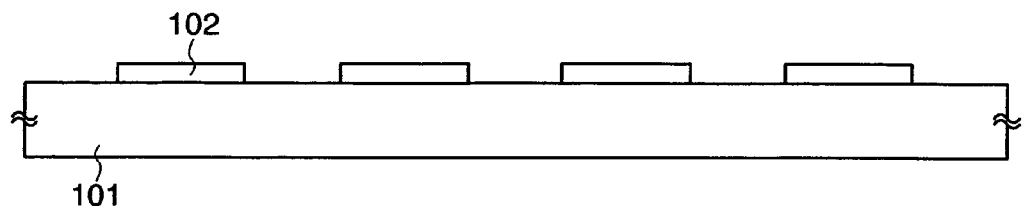
FIGS. 1A to 1D are views each showing an example of a manufacturing method of a semiconductor device of the present invention.

Embodiment modes of the present invention will be hereinafter explained with reference to drawings. However, the present invention is not limited to the following explanations, and it is to be easily understood that various changes and modifications will be apparent to those skilled in the art. Therefore, unless such changes and modifications depart from the purport and the scope of the present invention, they should be construed as being included therein. Note that, in the structure of the present invention that will be hereinafter explained, the same reference numerals denoting the same portions are used in common in different drawings and the explanation is omitted in some cases.

Embodiment Mode 1

This embodiment will explain an example of a manufacturing method of a semiconductor device of the present invention with reference to drawings.

First, an element group 102 is formed over a substrate 101 (FIG. 1A). In this embodiment mode, the element group 102 constituting a semiconductor device is provided in plural over the substrate 101. By forming the element group 102 in plural over the substrate 101, a plurality of semiconductor devices can be manufactured from one substrate, which is preferable.

As the substrate 101, a glass substrate, a quartz substrate, a metal substrate or a stainless steel substrate where an insulating film is formed over one surface, a heat-resistant plastic substrate that can withstand a processing temperature in this process, or the like is preferably used. Such a substrate 101 does not have a limit in its area or shape; therefore, as long as a rectangular substrate one side of which is 1 meter or more is used as the substrate 101, for example, productivity can be improved significantly. Besides, a semiconductor substrate such as a Si substrate may also be used.

The element group 102 includes a semiconductor element such as a transistor or a diode, for example. As the transistor, a thin film transistor (TFT) where a semiconductor film, which is formed over a rigid substrate such as glass, is used as a channel, a field effect transistor (FET) over a semiconductor substrate such as a Si substrate, where the substrate is used as a channel, an organic TFT where an organic material is used as a channel, or the like can be provided. In addition, as the diode, various diodes such as a variable capacitance diode, a Schottky diode, and a tunnel diode can be applied. In the present invention, by using these transistors, diodes, or the like, any sort of integrated circuits including a CPU, a memory, a microprocessor, various sensors such as a temperature sensor; a humidity sensor; and a biosensor, and the like can be provided. Moreover, as the element group 102, the present invention includes a mode having an antenna in addition to the semiconductor element such as a transistor. A semiconductor device where the element group 102 is provided with an antenna can be operated by using an AC voltage that is generated in the antenna and data can be transmitted and received without contact with a piece of external equipment (a reader/writer) by modulating an AC voltage that is applied to the antenna. Note that the antenna may be formed along with an integrated circuit having a transistor or may be electrically connected to an integrated circuit after being formed separately from the integrated circuit.

Figure 1B:
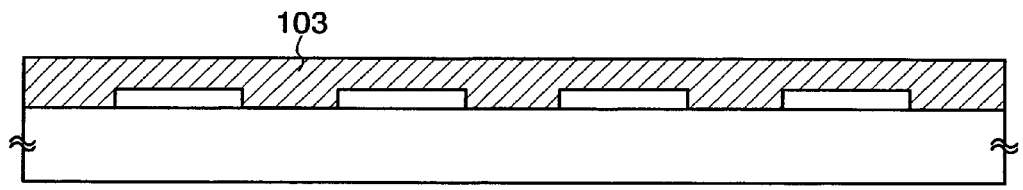

Next, an insulating film 103 is formed so as to cover the element group 102 (FIG. 1B). The insulating film 103 is provided above a plurality of the element groups 102 and between the element groups, and serves as a protective film of the element group 102.

The insulating film 103 can be provided with a single-layer structure of an insulating film containing oxygen and/or nitrogen such as a silicon oxide ($SiO_x$) film, a silicon nitride ($SiN_x$) film, a silicon oxynitride ($SiO_xN_y$) (X>Y) film, or a silicon nitride oxide ($SiN_xO_y$) (X>Y) film, a film containing carbon such as a DLC (diamond like carbon) film, an organic material such as epoxy, polyimide, polyamide, polyvinyl phenol, benzocyclobutene, or acrylic, or a siloxane material such as a siloxane resin; or a stacked structure thereof. Note that the siloxane material corresponds to a material having Si—O—Si bonds. Siloxane has a skeleton formed of a bond of silicon (Si) and oxygen (O). As a substituent, an organic group containing at least hydrogen (for example, an alkyl group or aromatic hydrocarbon) is used. As a substituent, a fluoro group can also be used. Alternatively, an organic group containing at least hydrogen and a fluoro group may be used as a substituent.

Figure 1C:
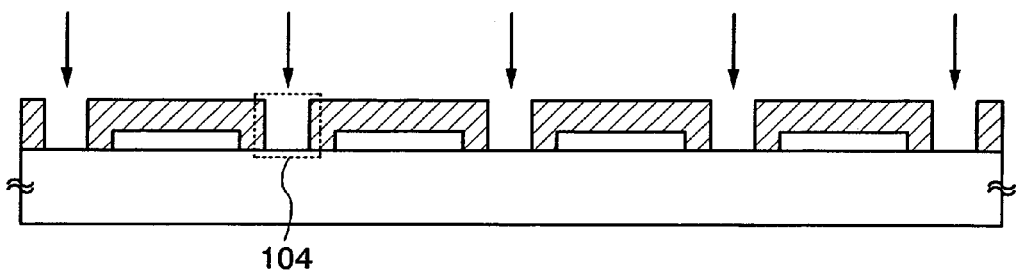

Then, an opening 104 is selectively formed in the insulating film 103 (FIG. 1C). The opening 104 is selectively formed by irradiating a portion between a plurality of the element groups 102 (here, a portion between the neighboring element groups 102) with laser light or by using a photolithography method. Note that the opening 104 is formed in a portion where the element group 102 is avoided, and here, the opening 104 is linearly formed by irradiating a portion between the element groups with laser light. Thus, it is preferable that the element group 102 be not exposed by forming the opening 104.

Figure 1D:
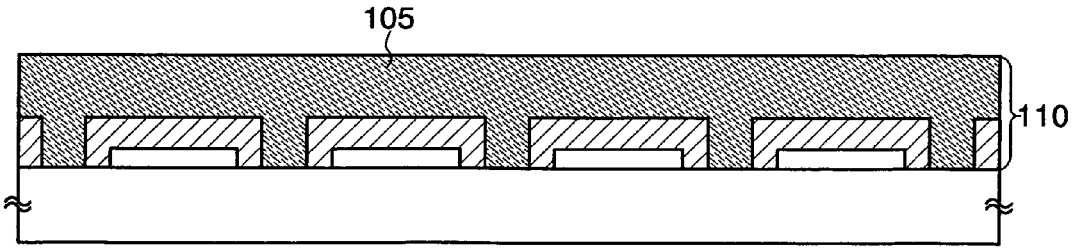

Next, a film 105 is formed so as to cover the insulating film 103 and the opening 104 (FIG. 1D). When a layer including the element group 102, the insulating film 103, and the film 105 (hereinafter, referred to as an element formation layer 110) is separated from the substrate 101, the element formation layer 110 is prevented from transforming by providing the film 105. In addition, here, it is preferable to form the film 105 so as to fill the opening 104 partially or entirely.

The film 105 can be a film made from polypropylene, polyester, vinyl, polyvinyl fluoride, polyvinyl chloride, or the like, paper of a fibrous material, a laminated film of a base film (polyester, polyamide, an inorganic vapor-deposited film, paper, or the like) and an adhesive synthetic resin film (an acrylic-based synthetic resin, an epoxy-based synthetic resin, or the like), or the like. The film is attached to an object to be treated by being subjected to heat treatment and pressure treatment. In performing heat treatment and pressure treatment, an adhesive layer provided over the uppermost surface of the film or a layer (not an adhesive layer) provided over the outermost layer is melted by heat treatment to be attached by applying pressure. An adhesive layer may be provided over the surface of the film; however, it is not necessarily provided. The adhesive layer corresponds to a layer containing an adhesive such as a thermosetting resin, a UV curing resin, an epoxy-based resin, or a resin additive. The film used for sealing is preferably coated with silica to prevent moisture or the like from entering the inside after sealing, and for example, a sheet material in which an adhesive layer, a film of polyester or the like, and silica coat are laminated can be used. Thus, the adhesive layers of these films are provided so as to fill the opening 104 partially or entirely.

In addition, a hot-melt adhesive can be used as the adhesive layer. The hot-melt adhesive is formed using a nonvolatile thermoplastic material that contains no water or solution, and remains in a solid state at room temperature. The hot-melt adhesive is a chemical substance that attaches objects together by applying the chemical substance in a dissolved state and cooling it. Further, the hot-melt adhesive has advantages of short adhesion time and being pollution-free, safe, hygienic, energy-saving, and low-cost. Since the hot-melt adhesive remains in the solid state at normal temperature, the hot-melt adhesive that has been processed into a film form or a fiber form in advance can be used. Alternatively, an adhesive layer that is formed over a base film made from polyester or the like in advance and then is processed into a film form can be used. A film in which a hot-melt film is formed over a base film made from polyethylene terephthalate is used here. The hot-melt film is formed using resin with a softening point that is lower than that of the base film. By performing heat treatment, only the hot-melt film is dissolved and becomes a rubbery state so that the dissolved hot-melt film is attached to an object. When cooling the hot-melt film, it is cured. As the hot-melt film, for example, a film containing as its main component ethylene-vinyl acetate copolymer (EVA), polyester, polyamide, thermoplastic elastomer, polyolefin, or the like can be used.

Figure 2A:
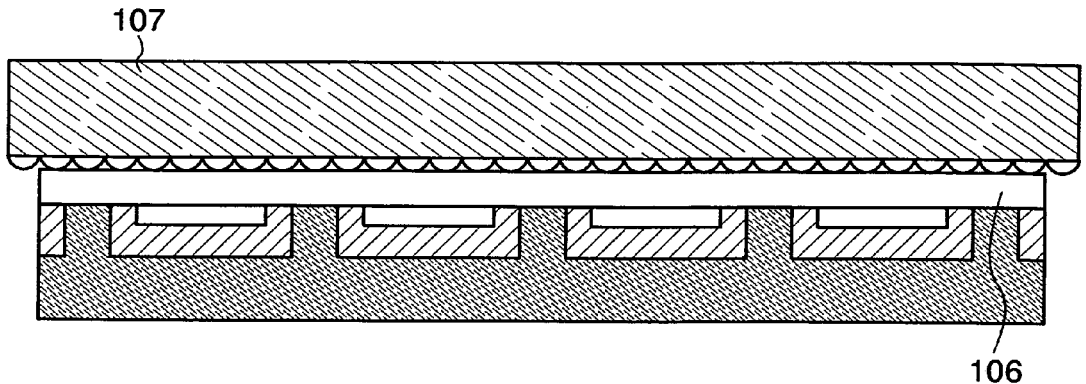
FIGS. 2A to 2D are views each showing an example of a manufacturing method of a semiconductor device of the present invention.

Then, the substrate 101 is thinned by a means 107 for thinning a film (FIG. 2A). Here, the substrate 101 is thinned by thinning the substrate 101 on which the element group 102 is formed from the opposite side of the substrate 101 (back surface) to be a substrate 106. In the case of thinning the substrate 101, it is preferable to thin as much as possible to reduce the processing time in the subsequent step (etching by chemical treatment). However, the substrate 101 is likely to be damaged due to the stress applied to the element formation layer 110 as the substrate 101 becomes thinner. Therefore, the thickness of the substrate 106 is made to be 5 to 50 μm, preferably 5 to 20 μm, and much preferably 5 to 10 μm.

As the means 107 for thinning a film, a physical means, and a physical means with a chemical means can be used, and for example, grinding treatment, polishing treatment, or the like can be used. As for grinding treatment, an upper surface of an object to be treated (here, a back surface of the substrate 101) is ground and smoothed using grains of a grinding stone. As for polishing treatment, the upper surface of the object to be treated is smoothed by a plastic smoothing action or frictional polishing action using an abrasive agent such as abrasive-coated cloth and paper or abrasive grains. In a case of performing grinding treatment or polishing treatment, purified water, polishing solution, or the like can be used. In addition, as polishing treatment, CMP (Chemical Mechanical Polishing) may also be used.

In this embodiment mode, grinding treatment is performed to the back surface of the substrate 101 and thereafter polishing treatment is performed to the back surface of the substrate 101; therefore, the substrate 101 is thinned to be the substrate 106. Note that one of grinding treatment and polishing treatment may be performed. In the case of performing either grinding treatment or polishing treatment, or both, it is preferable to thin the substrate 101 as much as possible. However, as the substrate 101 is thinned, the element formation layer 110 is likely to be stressed; thus, there is fear of being damaged due to a crack or the like.

Figure 4A:
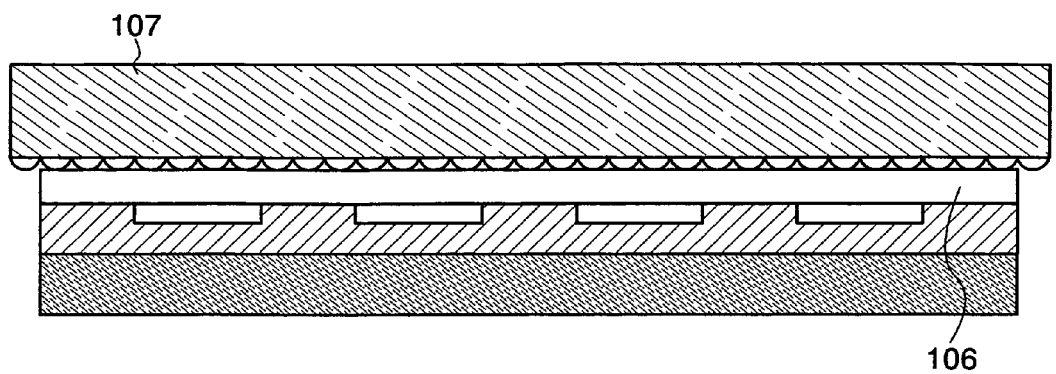
FIGS. 4A and 4B are views each showing an example of a manufacturing method of a semiconductor device of the present invention.
Figure 4B:
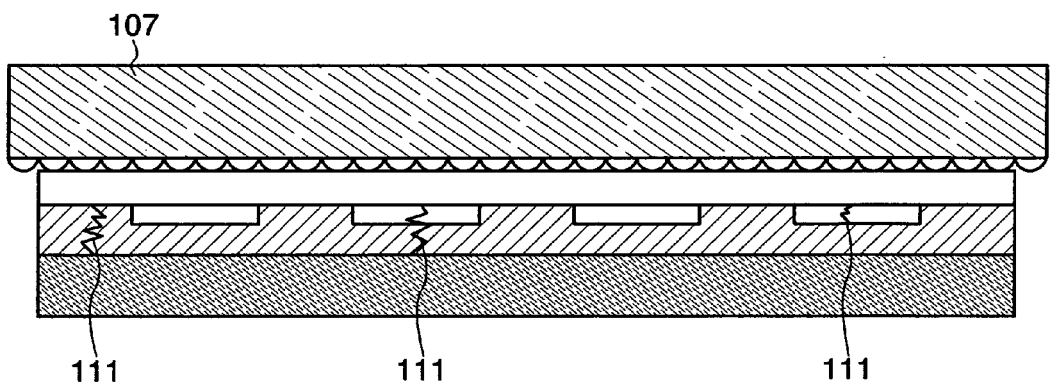

Generally, as shown in FIGS. 4A and 4B, in a case of performing grinding treatment or polishing treatment to a substrate 101 after forming an insulating film 103 and a film 105 above an element group 102 without providing an opening 104 (FIG. 4A), a crack 111 is generated in the element group 102 or the insulating film 103 when an element formation layer 110 is stressed (FIG. 4B).

On the other hand, in the manufacturing method described in this embodiment mode, there is a structure where the opening 104 is formed between a plurality of the element groups 102 (here, a portion between the neighboring element groups 102) at the phase before subjecting the substrate 101 to grinding treatment or polishing treatment. Therefore, there is an advantage that the stress applied to the element group 102 and the insulating film 103 is dispersed when the element formation layer 110 is stressed by grinding treatment or polishing treatment; thus, a crack is unlikely to be generated in the element group 102. In addition, when the stress is generated, the damage of the element group 102 can be suppressed effectively, as long as the stress is selectively applied to the film 105 provided to the opening 104. Therefore, in consideration of the material of the insulating film 103 and the film 105 covering the element group 102, for example, it is preferable to form the film 105 with a material that is bent more easily than the element group 102 or the insulating film 103.

The material used for the film 105 preferably has a property of being bent more easily than that of the element group 102 or the insulating film 103. For example, a material exhibiting elasticity or a material having plasticity can be used. Note that, in the case of using a material exhibiting elasticity, the material used for the film 105 is set to have a lower elastic modulus (ratio of stress to strain) than that of a material used for the insulating film 103. In the case of using a material having plasticity, the material used for the film 105 is set to have higher plasticity than that of a material provided in the insulating film 103. Note that the elasticity here refers to a property of an object whose shape or volume is changed by external force to return to its original condition after the force is removed. In addition, the plasticity here means a property of being easily deformed by external force and kept strained even after removing the force.

In addition, in a case of using a high molecular weight organic compound or the like having a glass transition temperature as the insulating film 103 or the film 105, the material used for the film 105 is set to have a lower glass transition point than that of a material used for the insulating film 103. A material having a low glass transition point has higher viscoelasticity than that of a material having a high glass transition point. Therefore, in a case where the material having a low glass transition and the material having a high glass transition are provided, large strain is selectively generated in the material having a low glass transition point when stress is applied. Thus, the damage of the element group 102 covered with the insulating film 103 can be suppressed.

Figure 2B:
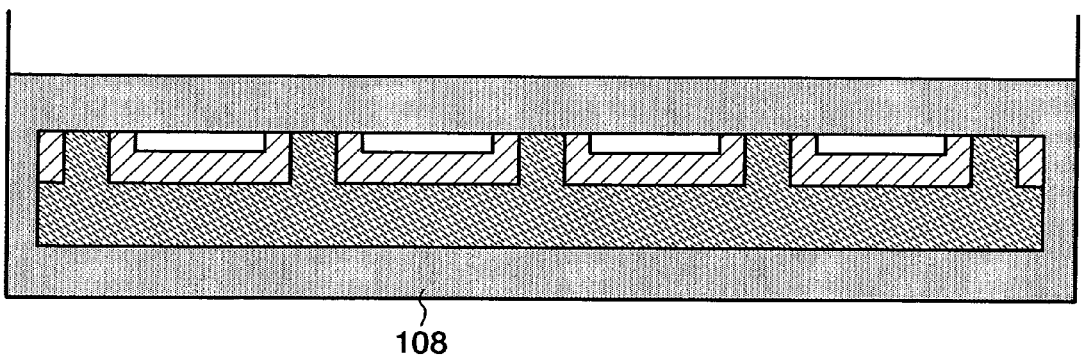

Next, the thinned substrate 106 is removed by performing chemical treatment thereto (FIG. 2B). As chemical treatment, chemical etching is performed to an object to be treated by using a chemical solution. Here, the etching of the substrate 106 is performed by dipping the substrate 106 and the element formation layer 110 into a chemical solution 108. Any chemical solution is accepted as the chemical solution 108 as long as the substrate can be removed, and for example, it is preferable to use a solution containing hydrofluoric acid as the chemical solution 108 in a case of using a glass substrate as the substrate 101. Note that, as the film 105, it is preferable to use a material that is unlikely to react with the chemical solution 108. In addition, a base film may be formed between the substrate 101 and the element group 102 with a material that is unlikely to react with the chemical solution 108. In a case of using a glass substrate as the substrate 101 and removing the glass substrate by being dipped into hydrofluoric acid, it is preferable to provide the base film with nitride, and for example, a single-layer structure of an insulating film containing nitrogen such as a silicon nitride ($SiN_x$) film, a silicon oxynitride ($SiO_xN_y$) (X>Y) film, or a silicon nitride oxide ($SiN_xO_y$) (X>Y) film; or a stacked structure thereof.

Note that, in the above steps, the substrate 101 may be removed by grinding treatment, polishing treatment, or the like. However, in a case of performing grinding treatment or polishing treatment with a state where the substrate 101 is thinned, it is difficult to obtain a uniform thin film and probability that the damage due to the generation of stress applied to the element formation layer 110 is increased. On the other hand, the substrate 101 may be removed by using chemical treatment without grinding treatment and polishing treatment; however, in this case, there is fear that it takes up much time to remove the substrate 101 and throughput speed is decreased. Moreover, there is fear that the element formation layer 110 has a harmful effect by dipping the element formation layer in the chemical solution for a long time.

Therefore, in the present invention, after once performing grinding treatment, polishing treatment, or the like and thinning the substrate 101 to some extent when the substrate is removed, the thinned substrate is removed using chemical treatment. Thus, stress or the like applied to the element formation layer can be suppressed, and throughput speed can be improved.

Figure 2C:
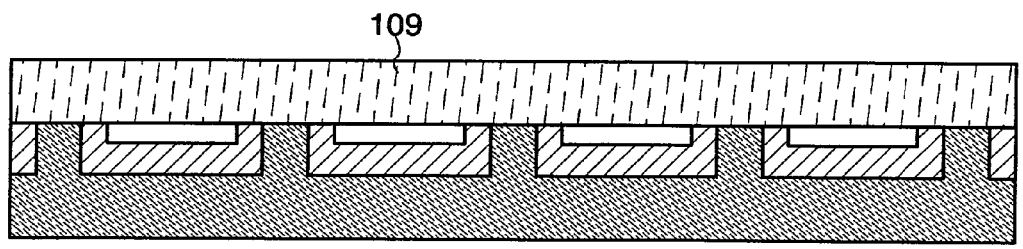

Then, a film 109 is formed over one surface of the element formation layer 110 (a surface where the substrate 101 is removed) to perform sealing treatment to the element formation layer 110 (FIG. 2C).

The film 109 can be a film made from polypropylene, polyester, vinyl, polyvinyl fluoride, polyvinyl chloride, or the like, paper of a fibrous material, a laminated film of a base film (polyester, polyamide, an inorganic vapor-deposited film, paper, or the like) and an adhesive synthetic resin film (an acrylic-based synthetic resin, an epoxy-based synthetic resin, or the like), or the like. The film is attached to an object to be treated by being subjected to heat treatment and pressure treatment. In performing heat treatment and pressure treatment, an adhesive layer provided over the uppermost surface of the film or a layer (not an adhesive layer) provided over the outermost layer is melted by heat treatment to be attached by applying pressure. An adhesive layer may be provided over the surface of the film; however, it is not necessarily provided. The adhesive layer corresponds to a layer containing an adhesive such as a thermosetting resin, a UV curing resin, an epoxy-based resin, or a resin additive. The film used for sealing is preferably coated with silica to prevent moisture or the like from entering the inside after sealing, and for example, a sheet material in which an adhesive layer, a film of polyester or the like, and silica coat are laminated can be used.

In addition, a hot-melt adhesive can be used as the adhesive layer. The hot-melt adhesive is formed using a nonvolatile thermoplastic material that contains no water or solution, and remains in a solid state at room temperature. The hot-melt adhesive is a chemical substance that attaches objects together by applying the chemical substance in a dissolved state and cooling it. Further, the hot-melt adhesive has advantages of short adhesion time and being pollution-free, safe, hygienic, energy-saving, and low-cost. Since the hot-melt adhesive remains in the solid state at normal temperature, the hot-melt adhesive that has been processed into a film form or a fiber form in advance can be used. Alternatively, an adhesive layer that is formed over a base film made from polyester or the like in advance and then is processed into a film form can be used. A film in which a hot-melt film is formed over a base film made from polyethylene terephthalate is used here. The hot-melt film is formed using resin with a softening point that is lower than that of the base film. By performing heat treatment, only the hot-melt film is dissolved and becomes a rubbery state so that the dissolved hot-melt film is attached to an object. When cooling the hot-melt film, it is cured. As the hot-melt film, for example, a film containing as its main component ethylene-vinyl acetate copolymer (EVA), polyester, polyamide, thermoplastic elastomer, polyolefin, or the like can be used.

Figure 2D:
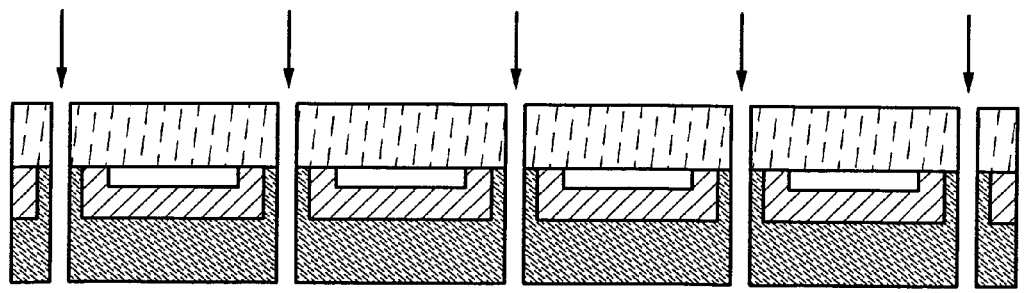

Next, the element formation layer 110 and the film 109 are cut, and a plurality of the element groups provided over the substrate 101 is separated into each element group (FIG. 2D). At this time, it is preferable to separate so that the film 105 and the film 109 are exposed without exposing the insulating film 103. This is because, when the insulating film 103 is exposed, moisture or an impurity element is mixed into the insulating film 103, thereby deteriorating characteristics of the element group 102.

Figure 3A:
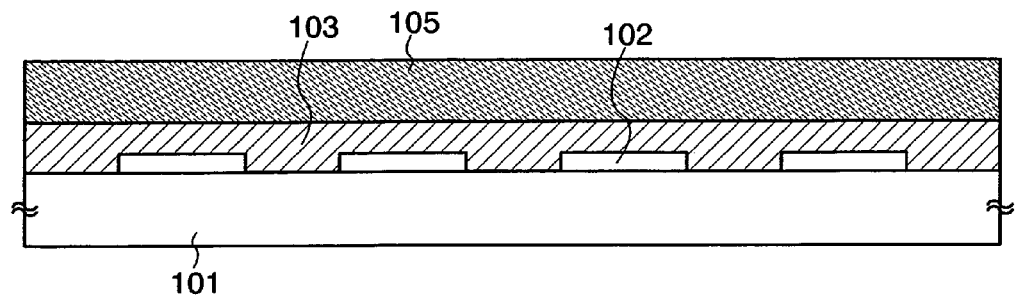
FIGS. 3A to 3C are views each showing an example of a manufacturing method of a semiconductor device of the present invention.
Figure 3B:
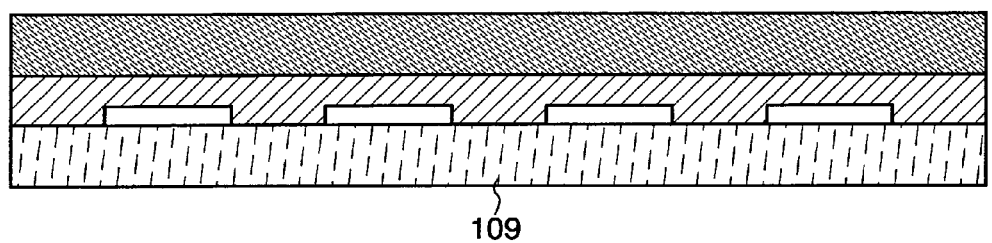
Figure 3C:
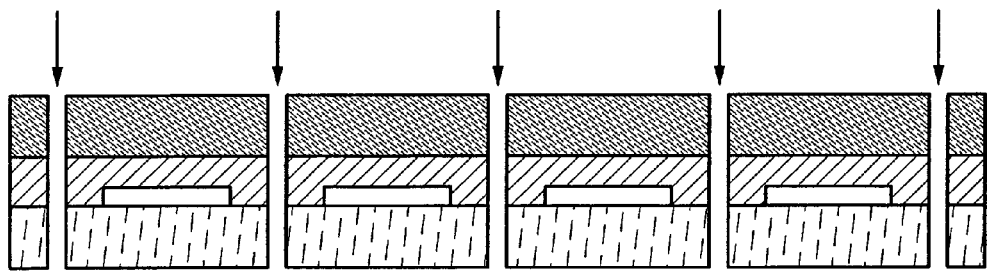

Generally, as shown in FIGS. 3A to 3C, in a case of separating a plurality of the element groups provided over the substrate 101 into each element group (FIG. 3C) after forming an insulating film 103 and a film 105 above an element group 102 without providing an opening 104 (FIG. 3A) and removing a substrate 101 to form a film 109 (FIG. 3B), there is a structure where the insulating film 103 is exposed on the side surface. On the other hand, a semiconductor device that is obtained using the manufacturing method described in this embodiment mode is made to have a structure where the opening 104 is formed between a plurality of the element groups 102 to provide the opening with the film 105 at the phase before removing the substrate 101. Therefore, as shown in FIG. 2D, there can be a structure where the element group 102 and the insulating film 103 are covered with the film 105 and the film 109 when separated into each element. Much specifically, in the structure, the element group 102 is covered with the insulating film 103 and the film 109 without being exposed, and the insulating film 103 is covered with the film 105 and the film 109 without being exposed. Consequently, moisture or an impurity element is suppressed from entering into the element group 102 and the insulating film 103, and reliability of a semiconductor device can be improved.

Through the above steps, a semiconductor device can be formed.

Embodiment Mode 2

This embodiment mode will explain a manufacturing method of a semiconductor device which is different from that in the above embodiment mode with reference to drawings. Specifically, a manufacturing method of a semiconductor device of the present invention including a thin film transistor, a memory element, and an antenna will be explained with reference to drawings.

Figure 5A:
FIGS. 5A to 5D are views each showing an example of a manufacturing method of a semiconductor device of the present invention.

First, an insulating film 202 to be a base is formed over one surface of a substrate 201, and a semiconductor film 203 is formed over the insulating film 202 (FIG. 5A). Note that the insulating film 202 and the semiconductor film 203 can be formed continuously.

As the substrate 201, a glass substrate, a quartz substrate, a metal substrate or a stainless steel substrate where an insulating film is formed over one surface, a heat-resistant plastic substrate that can withstand a processing temperature in this process, or the like is preferably used. Such a substrate 201 does not have a limit in its area or shape; therefore, as long as a rectangular substrate one side of which is 1 meter or more is used as the substrate 201, for example, productivity can be improved significantly. Besides, a semiconductor substrate such as a Si substrate may also be used.

The insulating film 202 can be provided by a CVD method, a sputtering method, or the like with a single-layer structure of an insulating film containing oxygen and/or nitrogen such as a silicon oxide ($SiO_x$) film, a silicon nitride ($SiN_x$) film, a silicon oxynitride ($SiO_xN_y$) (X>Y) film, or a silicon nitride oxide ($SiN_xO_y$) (X>Y) film; or a stacked structure thereof. When the insulating film to be a base has a two-layer structure, for example, it is preferable to form a silicon nitride oxide film as a first layer, and a silicon oxynitride film as a second layer. When the insulating film to be a base has a three-layer structure, for example, it is preferable to form a silicon oxide film as a first layer, a silicon nitride oxide film as a second layer, and a silicon oxynitride film as a third layer. Alternatively, it is preferable to form a silicon oxynitride film as a first layer, a silicon nitride oxide film as a second layer, and a silicon oxynitride film as a third layer. The insulating film to be a base serves as a blocking film that prevents impurities from the substrate 201 from entering.

The semiconductor film 203 can be formed with an amorphous semiconductor or a semi-amorphous semiconductor (SAS). Alternatively, a polycrystalline semiconductor film may be used. The SAS has an intermediate structure between an amorphous structure and a crystalline structure (including a single crystal and a polycrystal) and a third state which is stable in terms of free energy, and the SAS includes a crystalline region having short-range order and lattice distortion. In at least part of a region of the film, a crystal region of 0.5 to 20 nm can be observed. In a case of containing silicon as a main component, a Raman spectrum is shifted to a lower wavenumber side than 520 $cm^{-1}$. A diffraction peak of (111) or (220) to be caused by a crystal lattice of silicon is observed in X-ray diffraction. Hydrogen or halogen of at least 1 atomic % or more is contained to terminate dangling bonds. The SAS is formed by performing glow discharge decomposition (plasma CVD) to a gas containing silicon. $SiH_4$ is given as the gas containing silicon. In addition, $Si_2H_6$, $SiH_2Cl_2$, $SiHCl_3$, $SiCl_4$, $SiF_4$, or the like can also be used as the gas containing silicon. In addition, $GeF_4$ may also be mixed. The gas containing silicon may be diluted with $H_2$, or $H_2$ and one or more rare gas elements of He, Ar, Kr, and Ne. A dilution ratio thereof may range from 2 to 1000 times; a pressure, approximately 0.1 to 133 Pa; a power supply frequency, 1 to 120 MHz, preferably, 13 to 60 MHz; and substrate heating temperatures, 300° C. or less. A concentration of an atmospheric constituent impurity such as oxygen, nitrogen, or carbon, as an impurity element in the film, is desirably $1\times10^{20}$ atoms/$cm^3$ or less; in particular, a concentration of oxygen is $5\times10^{19}$ atoms/$cm^3$ or less, preferably $1\times10^{19}$ atoms/$cm^3$ or less. Here, an amorphous semiconductor film is formed in 25 to 200 nm thick (preferably, 30 to 150 nm thick) with a material containing silicon (Si) as its main component (such as $Si_xGe_{1-x}$) using a sputtering method, a CVD method, or the like.

Figure 5B:
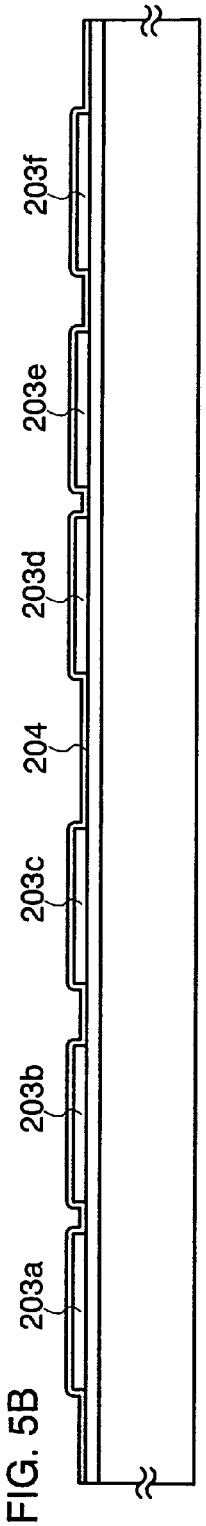

Next, a crystalline semiconductor film is formed by crystallizing the amorphous semiconductor film 203 by a crystallization method such as a laser crystallization method, a thermal crystallization method using RTA or an annealing furnace, a thermal crystallization method using a metal element which promotes crystallization, or the like. In addition, the crystallization of the semiconductor film can also be performed by generating thermal plasma by application of a DC bias and applying the thermal plasma to the semiconductor film. Then, the obtained semiconductor film is etched into a desired shape to form crystalline semiconductor films 203a to 203f, and a gate insulating film 204 is formed so as to cover the semiconductor films 203a to 203f (FIG. 5B).

Hereinafter, an example of a manufacturing process of the semiconductor films 203a to 203f will be briefly explained. First, an amorphous semiconductor film of 66 nm thick is formed by using a plasma CVD method. Next, after holding a solution containing nickel which is a metal element which promotes crystallization over the amorphous semiconductor film, a crystalline semiconductor film is formed by performing dehydrogenation treatment (at 500° C. for an hour) and thermal crystallization treatment (at 550° C. for 4 hours) to the amorphous semiconductor film. Thereafter, if necessary, the crystalline semiconductor film is irradiated with laser light and the crystalline semiconductor films 203a to 203f are formed by using a photolithography method.

In the case of forming the crystalline semiconductor film with a laser crystallization method, a continuous wave laser beam (CW laser beam) or a pulsed wave laser beam (pulsed laser beam) can be used. As the laser beam that can be used here, a laser beam oscillated from one or more of a gas laser such as an Ar laser, a Kr laser, and an excimer laser; a single crystal of a YAG laser, a $YVO_4$ laser, forsterite ($Mg_2SiO_4$), a $YAlO_3$ laser, and a $GdVO_4$ laser or a polycrystal (ceramic) of YAG, $Y_2O_3$, $YVO_4$, $YAlO_3$, and $GdVO_4$ doped with one or more kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used. By emitting a laser beam of second to fourth wave of a fundamental wave in addition to a fundamental harmonic of the above laser beams, a crystal having a large grain size can be obtained. For example, a second harmonic (532 nm) or a third harmonic (355 nm) of Nd: $YVO_4$ laser (fundamental, 1064 nm) can be used. At this time, the laser requires power density of approximately from 0.01 to 100 $MW/cm^2$ (preferably, approximately from 0.1 to 10 $MW/cm^2$). The laser is emitted at a scanning rate of approximately 10 to 2000 cm/sec. Note that a laser using, as a medium, single crystal of YAG, $YVO_4$, forsterite ($Mg_2SiO_4$), $YAlO_3$, or $GdVO_4$ or polycrystal (ceramic) of YAG, $Y_2O_3$, $YVO_4$, $YAlO_3$, or $GdVO_4$ doped with one or more kinds of Nd, Yb, Cr, Ti, Ho, Er, Tm, and Ta as a dopant; an Ar ion laser; or a Ti: sapphire laser can be continuously oscillated. Further, pulse oscillation thereof can be performed with an oscillation frequency of 10 MHz or more by performing Q switch operation, mode synchronization, or the like. When a laser beam is oscillated with a repetition rate of 10 MHz or more, a semiconductor film is irradiated with a next pulse during the semiconductor film is melted by the laser beam and then is solidified. Thus, differing from a case of using a pulse laser with a low repetition rate, a solid-liquid interface can be continuously moved in the semiconductor film so that crystal grains, which continuously grow toward a scanning direction, can be obtained.

In addition, the crystallization of the amorphous semiconductor film by using the metal element for promoting crystallization is advantageous in that the crystallization can be performed at low temperature in short time and the direction of crystals becomes uniform, while there is a problem in that the property is not stable because the off current is increased due to a residue of the metal element in the crystalline semiconductor film. Therefore, it is preferable to form an amorphous semiconductor film serving as a gettering site over the crystalline semiconductor film. In order to form a gettering site, the amorphous semiconductor film is required to contain an impurity element such as phosphorous and argon; therefore, the amorphous semiconductor film is preferably formed by a sputtering method by which argon can be contained at a high concentration. Thereafter, heat treatment (an RTA method, thermal annealing using an annealing furnace, or the like) is performed to diffuse the metal element into the amorphous semiconductor film, and the amorphous semiconductor film containing the metal element is removed. Thus, the content of the metal element in the crystalline semiconductor film can be reduced or removed.

The gate insulating film 204 is formed by a single layer or a stacked layer of a film containing oxide of silicon or nitride of silicon by a CVD method, a sputtering method, or the like. Specifically, a film containing silicon oxide, a film containing silicon oxynitride, or a film containing silicon nitride oxide is formed in a single layer structure or formed by being stacked.

In addition, the gate insulating film 204 may also be formed by performing high-density plasma treatment to the semiconductor films 203a to 203f to oxide or nitride surfaces thereof. For example, the gate insulating film 204 is formed by plasma treatment where a mixed gas of a rare gas such as He, Ar, Kr, or Xe; and oxygen, nitrogen oxide ($NO_2$), ammonia, nitrogen, hydrogen, and the like is introduced. In this case, when excitation of plasma is performed by introducing a microwave, high-density plasma can be generated at a low electron temperature. The surfaces of the semiconductor films can be oxidized or nitrided by oxygen radicals (OH radicals may be included) or nitrogen radicals (NH radicals may be included) generated by this high-density plasma.

With such treatment using high-density plasma, the insulating film having a thickness of 1 to 20 nm, typically 5 to 10 nm, is formed over the semiconductor films. Since a reaction of this case is a solid-phase reaction, an interface state density between the insulating film and the semiconductor films can be made extremely low. In such high-density plasma treatment, since the semiconductor films (crystalline silicon or polycrystalline silicon) are directly oxidized (or nitrided), variation in a thickness of the insulating film that is formed can be ideally made to be extremely small. In addition, since the semiconductor films in a crystal grain boundary of crystalline silicon are not oxidized too much, an extremely desirable state can be obtained. In other words, in the high-density plasma treatment described here, by solid-phase oxidation of the semiconductor film surfaces, the insulating film which has favorable uniformity and low interface state density can be formed without excessive oxidation in a crystal grain boundary.

As for the gate insulating film, only the insulating film formed by high-density plasma treatment may be used. Alternatively, an insulating film of silicon oxide, silicon oxynitride, silicon nitride, or the like may be deposited or stacked to the insulating film by a CVD method using plasma or a thermal reaction. In any case, characteristic variation can be reduced in a transistor including the insulating film formed by high-density plasma as part or the entire of the gate insulating film.

Moreover, the semiconductor films 203a to 203f, which is obtained by scanning the semiconductor film in one direction to be crystallized while irradiated with a continuous wave laser beam or a laser beam oscillating with a frequency of 10 MHz or more, have a characteristic that crystals are grown in a scanning direction of the beam. A transistor (TFT) in which characteristic variation is reduced and field effect mobility is high can be obtained by arranging the transistor so that the scanning direction is aligned with a channel length direction (a direction in which carriers are flown when a channel forming region is formed) and by combining the above gate insulating film.

Then, a first conductive film and a second conductive film are stacked over the gate insulating film 204. The first conductive film is formed by a plasma CVD method, a sputtering method, or the like to have a thickness of 20 to 100 nm. The second conductive film is formed by a plasma CVD method, a sputtering method, or the like to have a thickness of 100 to 400 nm. The first conductive film and the second conductive film are formed with an element of tantalum (Ta), tungsten (W), titanium (Ti), molybdenum (Mo), aluminum (Al), copper (Cu), chromium (Cr), niobium (Nb), and the like; or an alloy material or a compound material containing the element as its main component. Alternatively, the first conductive film and the second conductive film are formed with a semiconductor material typified by polycrystalline silicon doped with an impurity element such as phosphorus. As an example of a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, and the like can be given. Since tungsten and tantalum nitride have high heat resistance, heat treatment for thermal activation can be performed after forming the first conductive film and the second conductive film. In a case of not a two-layer structure but a three-layer structure, a stacked structure of a molybdenum film, an aluminum film, and a molybdenum film is preferably employed.

Next, a resist mask is formed using a photolithography method and etching treatment for forming a gate electrode and a gate line is performed to form a conductive film (hereinafter, referred to as a gate electrode 205) serving as a gate electrode. Here, the gate electrode 205 is provided with a structure where any of the above materials are stacked.

Then, a resist mask is formed by a photolithography method and an impurity element imparting N-type conductivity is added to the semiconductor films 203b, 203c, 203e, and 203f at low concentration by an ion doping method or an ion implantation method to form N-type impurity regions 206. As the impurity element imparting N-type conductivity, an element belonging to Group 15 is preferably used, and phosphorus (P) or arsenic (As) is used, for example.

Figure 5C:
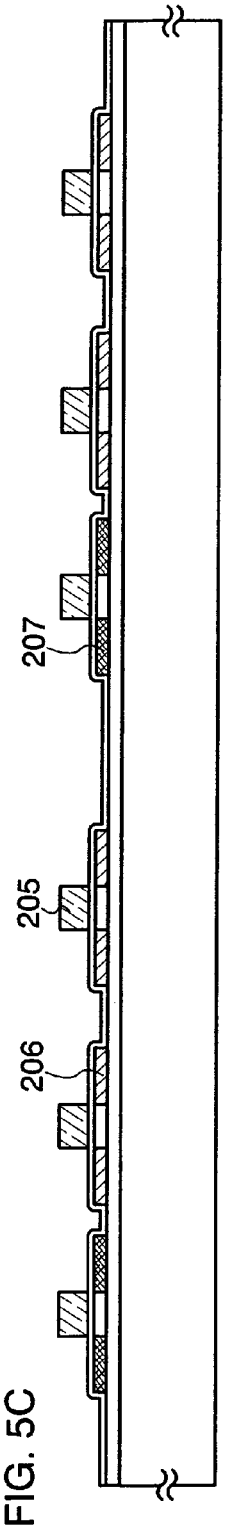

Thereafter, a resist mask is formed by a photolithography method and an impurity element imparting P-type conductivity is added to the semiconductor films 203a and 203d to form P-type impurity regions 207. As the impurity element imparting P-type conductivity, boron (B) is used, for example (FIG. 5C).

Next, an insulating film is formed so as to cover the gate insulating film 204 and the gate electrode 205. The insulating film is formed by a plasma CVD method, a sputtering method, or the like with a single-layer structure or a stacked structure of a film containing an inorganic material such as silicon, oxide of silicon, and/or nitride of silicon, or a film containing an organic material such as an organic resin. Next, the insulating film is selectively etched by anisotropic etching, by which etching is performed mainly in a perpendicular direction, to form insulating films (also referred to as sidewalls) 208 in contact with side faces of the gate electrodes 205. At the same time as the manufacturing of the insulating films 208, the gate insulating film 204 is etched to form insulating films 210. The insulating films 208 are used as masks for doping in subsequently forming source and drain regions.

Figure 5D:
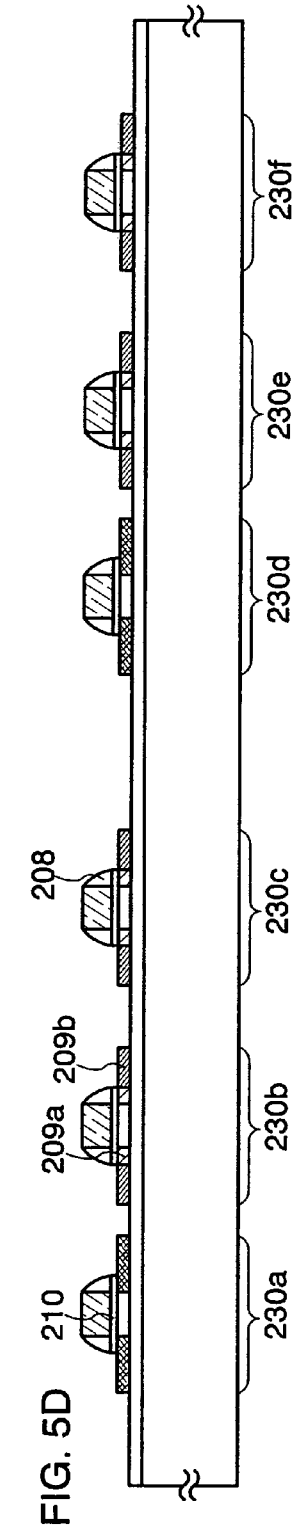

Then, with the use of the resist mask formed by a photolithography method and the insulating films 208 as masks, an impurity element imparting N-type conductivity is added to the semiconductor films 203b, 203c, 203e, and 203f to form first N-type impurity regions 209a (also referred to as LDD (Lightly Doped Drain) regions) and second N-type impurity regions 209b. The concentration of the impurity element contained in the first N-type impurity regions 209a is lower than that in the second N-type impurity regions 209b. Through the above steps, N-type thin film transistors 230b, 230c, 230e, and 230f, and P-type thin film transistors 230a and 230d are completed (FIG. 5D).

Note that, in order to form an LDD region, there are a technique of using a lower conductive film of a gate electrode, which is formed as a stacked structure of two layers or more, as a mask of the gate electrode by etching or performing anisotropic etching or the like so as to provided the gate electrode in a tapered shape, and a technique of using an insulating film which is a sidewall as a mask. A thin film transistor that is formed by employing the former technique has a structure where an LDD region is disposed to overlap with a gate electrode by interposing a gate insulating film therebetween. However, in order to utilize etching or anisotropic etching so as to provide the gate electrode in a tapered shape in this structure, it is difficult to control the width of the LDD region, and an LDD region cannot be formed in some cases as long as an etching step is not performed preferably. On the other hand, with the latter technique of using the insulating film which is a sidewall as a mask, the width of an LDD region can be easily controlled, and the LDD region can be formed certainly, as compared with the former technique.

Subsequently, a single layer or a stacked layer of an insulating film is formed so as to cover the thin film transistors 230a to 230f (FIG. 6A). The insulating film covering the thin film transistors 230a to 230f is formed by an SOG method, a droplet discharging method, or the like with a single layer or a stacked layer of an inorganic material such as oxide of silicon and/or nitride of silicon, an organic material such as polyimide, polyamide, benzocyclobutene, acrylic, epoxy, or siloxane, or the like. For example, in a case where the insulating film covering the thin film transistors 230a to 230f has a three-layer structure, it is preferable to form a film containing silicon oxide as an insulating film 211 of a first layer, a film containing a resin as an insulating film 212 of a second layer, and a film containing silicon nitride as an insulating film 213 as a third layer.

Note that heat treatment for recovering crystallinity of the semiconductor films, activating the impurity elements added to the semiconductor films, or hydrogenating the semiconductor films is preferably performed before forming the insulating films 211 to 213 or after forming one or a plurality of the insulating films 211 to 213. The heat treatment is preferably performed by applying a thermal annealing method, a laser annealing method, an RTA method, or the like.

Next, the insulating films 211 to 213 are selectively etched by a photolithography method to form contact holes which expose the semiconductor films 203a to 203f. Subsequently, a conductive film is formed to fill the contact holes. The conductive film is patterned to form conductive films 214 serving as source and drain wirings.

The conductive films 214 are formed by a CVD method, a sputtering method, or the like with a single layer or a stacked layer of an element of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. The alloy material containing aluminum as its main component corresponds to, for example, a material containing aluminum as its component and nickel, or an alloy material containing aluminum as its main component, nickel, and either carbon or silicon, or both. The conductive films 214 may have, for example, a stacked structure of a barrier film, an aluminum silicon (Al—Si) film, and a barrier film, or a stacked structure of a barrier film, an aluminum silicon (Al—Si) film, a titanium nitride (TiN) film, and a barrier film. Note that the barrier film corresponds to a thin film of titanium, nitride of titanium, molybdenum, or nitride of molybdenum. Aluminum and aluminum silicon have low resistance and are inexpensive, which are optimum for a material of the conductive films 214. When upper and lower barrier layers are provided, generation of a hillock of aluminum or aluminum silicon can be prevented. By forming the barrier film of titanium that is an element having a high reducing property, even when a thin natural oxide film is formed over the crystalline semiconductor film, the natural oxide film can be reduced, so that favorable contact with the crystalline semiconductor film can be formed.

Then, an insulating film 215 is formed so as to cover the conductive films 214 (FIG. 6B). The insulating film 215 is formed with a single layer or a stacked layer of an inorganic material or an organic material by an SOG method, a droplet discharging method, or a printing method such as a screen printing method or a gravure printing method. In addition, the insulating film 215 is preferably formed to have a thickness of 0.75 to 3 μm.

Subsequently, the insulating film 215 is etched by a photolithography method to form contact holes which expose the conductive films 214 in the thin film transistors 230a, 230c, 230d, and 230f. Then, a conductive film is formed to fill the contact holes. The conductive film is formed of a conductive material using a plasma CVD method, a sputtering method, or the like. Next, the conductive film is patterned to form conductive films 216a to 216d. Note that each of the conductive films 216b and 216d serves as one of a pair of conductive films included in a memory element that is formed later. Thus, the conductive films 216b and 216d are preferably formed with a single layer or a stacked layer of titanium, or an alloy material or a compound material containing titanium as its main component. Titanium has low resistance, which leads to a reduction in size of a memory element and achievement of higher integration. In a photolithography step to form the conductive films 216a to 216d, wet etching processing is preferably performed so as not to damage the lower thin film transistors 230a to 230f, and hydrogen fluoride (HF) or ammonia peroxide is preferably used as an etchant.

Next, an insulating film 217 is formed so as to cover the end portions of the conductive films 216a to 216d. The insulating film 217 is formed with a single layer or a stacked layer of an inorganic material or an organic material by an SOG method, a droplet discharging method, or the like. In addition, the insulating film 217 is preferably formed to have a thickness of 0.75 to 3 μm.

Then, a conductive film 218 serving as an antenna is formed in contact with the conductive films 216a and 216c (FIG. 6C). The conductive film 218 is formed of a conductive material by a CVD method, a sputtering method, a printing method, a droplet discharging method, or the like. Preferably, the conductive film 218 is formed with a single layer or a stacked layer of an element of aluminum (Al), titanium (Ti), silver (Ag), copper (Cu), and gold (Au), or an alloy material or a compound material containing the element as its main component. Specifically, the conductive film 218 is formed by using paste containing silver by a screen printing method and then performing heat treatment at temperatures of 50 to 350° C. Note that an antenna having a preferable characteristic can be obtained by applying pressure at the time of the heat treatment, which is preferable. Alternatively, the conductive film 218 is formed by forming an aluminum film by a sputtering method and patterning the aluminum film. The aluminum film is preferably patterned by wet etching processing, and after the wet etching processing, heat treatment is preferably performed at temperatures of 200 to 300° C.

Next, an organic compound layer 219 serving as a memory element is formed to be in contact with the conductive films 216b and 216d (FIG. 7A). A material of which property or state changes by an electrical effect, an optical effect, a thermal effect, or the like is used as a material for the memory element. For example, a material, of which property or state changes by melting due to Joule heat, dielectric breakdown, or the like to cause an upper electrode and a lower electrode to short, may be used. Therefore, a thickness of a layer used for the memory element (here, the organic compound layer) is preferably 5 to 100 nm, much preferably, 10 to 60 nm.

Here, the organic compound layer 219 is formed by a droplet discharging method, a spin coating method, a vapor deposition method, or the like. Subsequently, a conductive film 220 is formed to be in contact with the organic compound layer 219. The conductive film 220 is formed by a sputtering method, a spin coating method, a droplet discharging method, a vapor deposition method, or the like.

Through the above steps, a memory element portion 231a including a stacked body of the conductive film 216b, the organic compound layer 219, and the conductive film 220, and a memory element portion 231b including a stacked body of the conductive film 216d, the organic compound layer 219, and the conductive film 220 are completed.

Note that a feature of the above manufacturing steps is to perform the step of forming the organic compound layer 219 after the step of forming the conductive film 218 serving as the antenna because heat resistance of the organic compound layer 219 is not high.

As an organic material used for the organic compound layer, for example, an aromatic amine-based compound (that is, a compound having a benzene ring-nitrogen bond) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD), polyvinyl carbazole (abbreviation: PVK), a phthalocyanine compound such as phthalocyanine (abbreviation: H$_2$Pc), copper phthalocyanine (abbreviation: CuPc), or vanadyl phthalocyanine (abbreviation: VOPc), or the like can be used. These materials have a high hole transporting property.

Besides, a material formed of a metal complex or the like having a quinoline skeleton or a benzoquinoline skeleton such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)-4-phenylphenolato-aluminum (abbreviation: BAlq), a material formed of a metal complex or the like having an oxazole-based or thiazole-based ligand such as bis[2-(2'-hydroxyphenyl)benzoxazolato]zinc (abbreviation: Zn(BOX)$_2$) or bis[2-(2'-hydroxyphenyl)benzothiazolato]zinc (abbreviation: Zn(BTZ)$_2$), or the like can be used. These materials have a high electron transporting property.

Other than the metal complexes, a compound or the like such as 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), or bathocuproin (abbreviation: BCP) can be used.

The organic compound layer may have a single-layer structure or a stacked structure. In the case of a stacked structure, materials can be selected from the aforementioned materials to form a stacked structure. Further, the above organic material and a light-emitting material may be laminated. As the light-emitting material, 4-dicyanomethylene-2-methyl-6-[2-(1,1,7,7-tetramethyljulolidine-9-yl)ethenyl]-4H-pyran (abbreviation: DCJT), 4-dicyanomethylene-2-t-butyl-6-[2-(1,1,7,7-tetramethyljulolidine-9-yl)ethenyl]-4H-pyran, periflanthene, 1,4-bis[2-(10-methoxy)-(1,1,7,7-tetramethyljulolidine-9-yl)ethenyl]-2,5-dicyanobenzene, N,N'-dimethylquinacridone (abbreviation: DMQd), coumarin 6, coumarin 545T, tris(8-quinolinolato)aluminum (abbreviation: Alq$_3$), 9,9'-bianthryl, 9,10-diphenylanthracene (abbreviation: DPA), 9,10-di(2-naphthyl)anthracene (abbreviation: DNA), 2,5,8,11-tetra-t-buthylperylene (abbreviation: TBP), or the like can be used.

A layer in which the above light-emitting material is dispersed may be used. In the layer in which the above light-emitting material is dispersed, an anthracene derivative such as 9,10-di(2-naphthyl)-2-tert-butylanthracene (abbreviation: t-BuDNA), a carbazole derivative such as 4,4'-di(N-carbazolyl)biphenyl (abbreviation: CBP), a metal complex such as bis[2-(2'-hydroxyphenyl)pyridinato]zinc (abbreviation: Znpp$_2$) or bis[2-(2'-hydroxyphenyl)benzoxazolato]zinc (abbreviation: ZnBOX), or the like can be used as a base material. In addition, tris(8-quinolinolato)aluminum (abbreviation: Alq$_3$), 9,10-di(2-naphthyl)anthracene (abbreviation: DNA), bis(2-methyl-8-quinolinolato)-4-phenylphenolato-aluminum (abbreviation: BAlq), or the like can be used.

Such an organic material is changed its property by a thermal effect or the like; therefore, a glass transition temperature (Tg) thereof is preferably 50 to 300° C., much preferably, 80 to 120° C.

In addition, a material in which metal oxide is mixed with an organic material or a light-emitting material may be used. Note that the material in which metal oxide is mixed includes a state in which metal oxide is mixed or stacked with the above organic material or the above light-emitting material. Specifically, it indicates a state which is formed by a co-evaporation method using plural evaporation sources. Such a material can be referred to as an organic-inorganic composite material.

For example, in a case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide.

In a case of mixing a substance having a high electron transporting property with metal oxide, it is preferable to use lithium oxide, calcium oxide, sodium oxide, potassium oxide, or magnesium oxide as the metal oxide.

A material of which property changes by an electrical effect, an optical effect, or a thermal effect may be used for the organic compound layer; therefore, for example, a conjugated high molecular compound doped with a compound (photoacid generator) which generates acid by absorbing light can also be used. As the conjugated high molecular compound, polyacetylenes, polyphenylene vinylenes, polythiophenes, polyanilines, polyphenylene ethynylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Note that the example of using an organic compound material as the memory element portions 231a and 231b is described here; however, the present invention is not limited thereto. For example, a phase change material such as a material which changes reversibly between a crystalline state and an amorphous state or a material which changes reversibly between a first crystalline state and a second crystalline state can be used. In addition, a material which changes only from an amorphous state to a crystalline state can also be used.

The material which reversibly changes between a crystalline state and an amorphous state is a material containing a plurality of elements of germanium (Ge), tellurium (Te), antimony (Sb), sulfur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. The material which reversibly changes between the first crystalline state and the second crystalline state is a material containing a plurality of elements of silver (Ag), zinc (Zn), copper (Cu), aluminum (Al), nickel (Ni), indium (In), antimony (Sb), selenium (Se), and tellurium (Te), for example, Ag—Zn, Cu—Al—Ni, In—Sb, In—Sb—Se, or In—Sb—Te. When using this material, a phase change is carried out between two different crystalline states. The material which changes only from an amorphous state to a crystalline state is a material containing a plurality of elements of tellurium (Te), tellurium oxide (TeO$_x$), palladium (Pd), antimony (Sb), selenium (Se), and bismuth (Bi), for example, Te—TeO$_2$, Te—TeO$_2$—Pd, or Sb$_2$Se$_3$/Bi$_2$Te$_3$.

Next, an insulating film 221 serving as a protective film is formed by an SOG method, a spin coating method, a droplet discharging method, a printing method, or the like to cover the memory element portions 231a and 231b and the conductive film 218 serving as the antenna. The insulating film 221 is formed of a film containing carbon such as DLC (Diamond Like Carbon), a film containing silicon nitride, a film containing silicon nitride oxide, or an organic material, preferably, an epoxy resin.

Then, as described in the above embodiment mode, an opening is selectively formed in an element formation layer 233 having the thin film transistors 230a to 230f, the conductive film 218 serving as the antenna, the memory element portions 231a and 231b, and the like, and a film 222 is formed so as to fill the element formation layer 233 and the opening (FIG. 7B).

The film 222 can be a film made from polypropylene, polyester, vinyl, polyvinyl fluoride, polyvinyl chloride, or the like, paper of a fibrous material, a laminated film of a base film (polyester, polyamide, an inorganic vapor-deposited film, paper, or the like) and an adhesive synthetic resin film (an acrylic-based synthetic resin, an epoxy-based synthetic resin, or the like), or the like. The film is attached to an object to be treated by being subjected to heat treatment and pressure treatment. In performing heat treatment and pressure treatment, an adhesive layer provided over the uppermost surface of the film or a layer (not an adhesive layer) provided over the outermost layer is melted by heat treatment to be attached by applying pressure. An adhesive layer may be provided over the surface of the film; however, it is not necessarily provided. The adhesive layer corresponds to a layer containing an adhesive such as a thermosetting resin, a UV curing resin, an epoxy-based resin, or a resin additive. The film used for sealing is preferably coated with silica to prevent moisture or the like from entering the inside after sealing, and for example, a sheet material in which an adhesive layer, a film of polyester or the like, and silica coat are laminated can be used.

Next, the substrate 201 is thinned to be a substrate 224 by performing either grinding treatment or polishing treatment, or both to the substrate 201 (FIG. 8A). Here, the side of the substrate 201 on which the element formation layer 223 is not formed (back surface) is subjected to grinding treatment, and thereafter, the back surface of the substrate 201 is further subjected to polishing treatment to thin the substrate 201, thereby obtaining the substrate 224. It is preferable to thin the substrate 201 as much as possible in the case of performing grinding treatment or polishing treatment to the substrate 201. However, the element formation layer 233 is easily stressed as the substrate 201 gets thinner; therefore, the substrate 224 is made to have a thickness of 5 to 50 μm, preferably 5 to 20 μm, and much preferably 5 to 10 μm.

Then, the substrate 224 is removed by chemical treatment (FIG. 8B). As chemical treatment, chemical etching is performed to an object to be treated by using a chemical solution. Here, the etching of the substrate 224 is performed by dipping the substrate 224 and the element formation layer 233 into a chemical solution. Any chemical solution is accepted as the chemical solution as long as the substrate can be removed, and for example, it is preferable to use a solution containing hydrofluoric acid as the chemical solution in a case of using a glass substrate as the substrate 201. Note that, as the film 222, it is preferable to use a material that is unlikely to react with the chemical solution, and an insulating film containing an epoxy resin is used here. In addition, since the insulating film 202 is in direct contact with the chemical solution after removing the substrate 201, it is preferable to use a material that has resistance to the chemical solution as the insulating film 202. For example, the insulating film 202 is provided preferably in a two-layer structure, where a silicon nitride oxide film is formed as a first layer and a silicon oxynitride film is formed as a second layer.

Figures 9A, 9B:
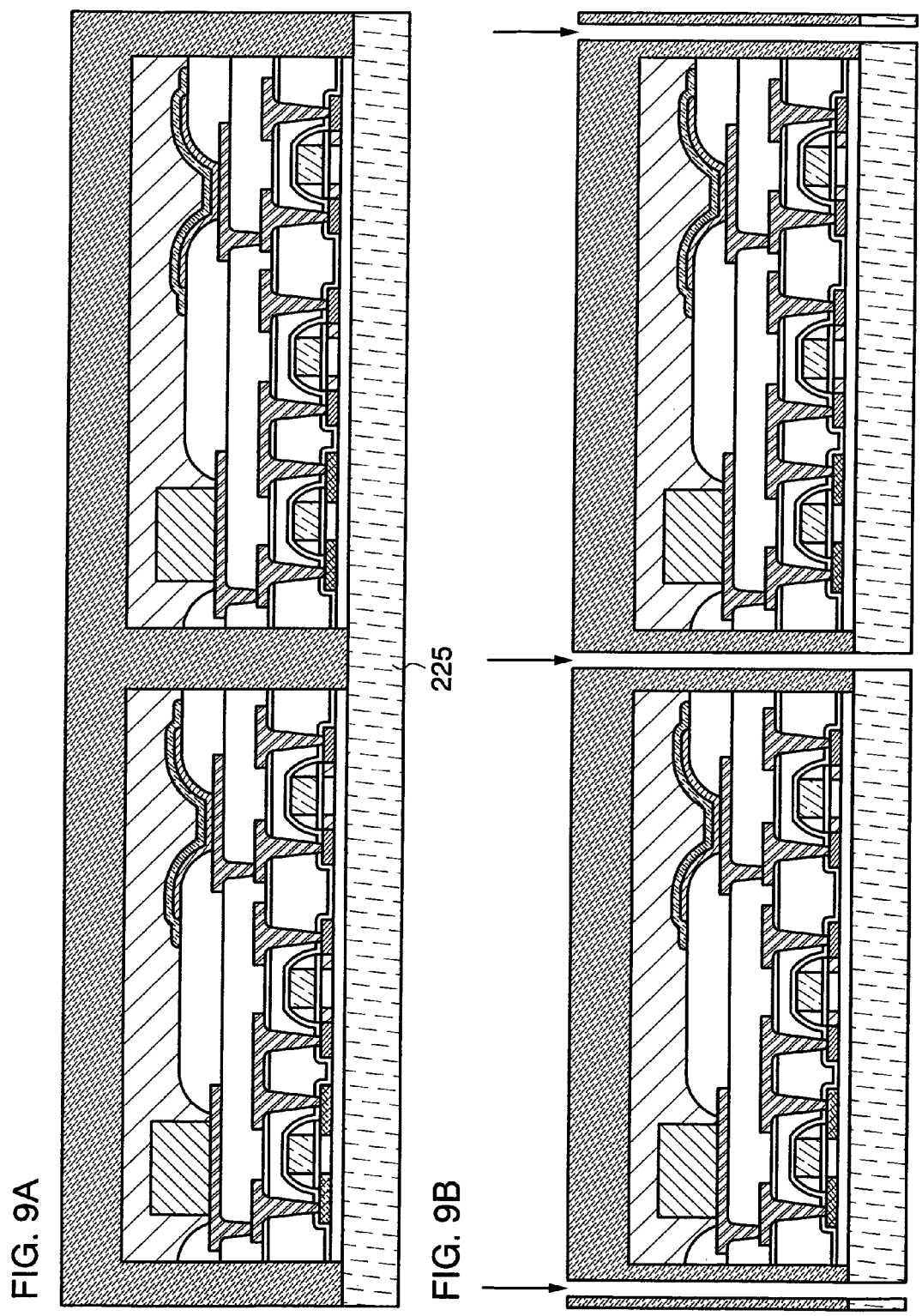
FIGS. 9A and 9B are views each showing an example of a manufacturing method of a semiconductor device of the present invention.
Figure 16:
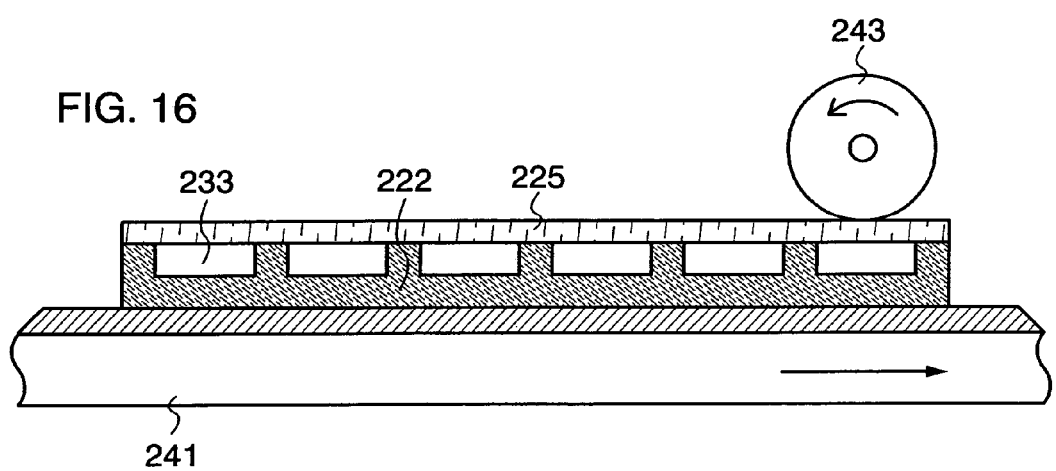
FIG. 16 is a view showing an example of a manufacturing method of a semiconductor device of the present invention.

Next, sealing treatment is performed by providing a film 225 for a side of the element formation layer 233 (FIG. 9A). As the sealing treatment, the film 225 is provided on one side of the element formation layer 233 (a side on which the substrate 201 is removed), and the film 225 is made to attach to the element formation layer 233 by using a roller 243 as shown in FIG. 16.

The film 225 for sealing can be a film made from polypropylene, polyester, vinyl, polyvinyl fluoride, polyvinyl chloride, or the like, paper of a fibrous material, a laminated film of a base film (polyester, polyamide, an inorganic vapor-deposited film, paper, or the like) and an adhesive synthetic resin film (an acrylic-based synthetic resin, an epoxy-based synthetic resin, or the like), or the like. The film is attached to an object to be treated by being subjected to heat treatment and pressure treatment. In performing heat treatment and pressure treatment, an adhesive layer provided over the uppermost surface of the film or a layer (not an adhesive layer) provided over the outermost layer is melted by heat treatment to be attached by applying pressure. An adhesive layer may be provided over the surface of the film 225; however, it is not necessarily provided. The adhesive layer corresponds to a layer containing an adhesive such as a thermosetting resin, a UV curing resin, an epoxy-based resin, or a resin additive. The film used for sealing is preferably coated with silica to prevent moisture or the like from entering the inside after sealing, and for example, a sheet material in which an adhesive layer, a film of polyester or the like, and silica coat are laminated can be used.

For example, as the film 225, a film where a hot-melt adhesive containing a thermoplastic resin is provided over a base film such as polyethylene terephthalate can be used. The hot-melt adhesive remains in a solid state at room temperature but is dissolved by applying heat. Therefore, a surface of the element formation layer 233 is provided with the film having the hot-melt adhesive and then subjected to heat treatment and pressure treatment by the roller 243; thus, the element formation layer 233 can be sealed. Note that, in the case of performing heat treatment with the roller 243, the treatment has to be performed at such a high temperature that the hot-melt adhesive is dissolved enough. Accordingly, in a case of using metal such as aluminum for a stage 241, there is fear that heat generated by the roller 243 is drawn to the stage 241; thus, the hot-melt adhesive is not dissolved enough. Therefore, it is preferable to provide a thermal insulation material such as silicon rubber between the stage 241 and an object to be treated.

As the film 222 and the film 225, a film subjected to antistatic treatment for preventing static electricity or the like (hereinafter, referred to as an antistatic film) may also be used. An antistatic film includes a film where an antistatic material is dispersed in a resin, a film to which an antistatic material is attached, and the like. A film containing an antistatic material may be a film having one side provided with an antistatic material, or a film having the both sides provided with an antistatic material. Further, in a film having one side provided with an antistatic material, a side containing an antistatic material may be attached to the inside or outside of the film. Note that an antistatic material may be provided over the entire surface or part of a film. An antistatic material herein includes metal, oxide of indium and tin (ITO), and a surfactant such as a zwitterionic surfactant, a cationic surfactant, and a nonionic surfactant. Instead, a resin material containing a cross-linked copolymer high molecular compound having a carboxyl group and a quaternary ammonium base in a side chain may be used as an antistatic material. An antistatic film may be obtained by attaching, kneading, or applying these materials to a film. When a semiconductor device is sealed with an antistatic film, the semiconductor element can be protected from external static electricity or the like when being handled as a product.

Note that, after performing sealing treatment of the element formation layer 233 with the film 225, sealing may be performed so as to cover the film 222, if necessary.

Then, the element formation layer 233, the film 222, and the film 225 are cut to separate into each element (FIG. 9B).

At this time, it is preferable to separate so that the film 222 and the film 225 are exposed without exposing the element formation layer 233. By covering the element formation layer 233 with the film 222 and the film 225 completely in such a manner, an impurity element or moisture is suppressed from mixing into a semiconductor element such as a thin film transistor from outside; thus, a highly reliable semiconductor device can be obtained.

Note that this embodiment mode can be implemented by being arbitrarily combined with the above embodiment mode. In other words, the material or the formation method described in the above embodiment mode can be used in combination also in this embodiment mode, and the material or the formation method described in this embodiment mode can be used in combination also in the above embodiment mode.

Embodiment Mode 3

This embodiment mode will explain an example of application modes of a semiconductor device that is obtained by using the manufacturing method described in the above embodiment mode. Specifically, applications of a semiconductor device which can exchange data without contact will be explained below with reference to drawings. The semiconductor device which can exchange data without contact is also referred to as an RFID (Radio Frequency Identification) tag, an ID tag, an IC tag, an IC chip, an RF (Radio Frequency) tag, a wireless tag, an electronic tag, or a wireless chip, depending on application modes.

Figure 10A:
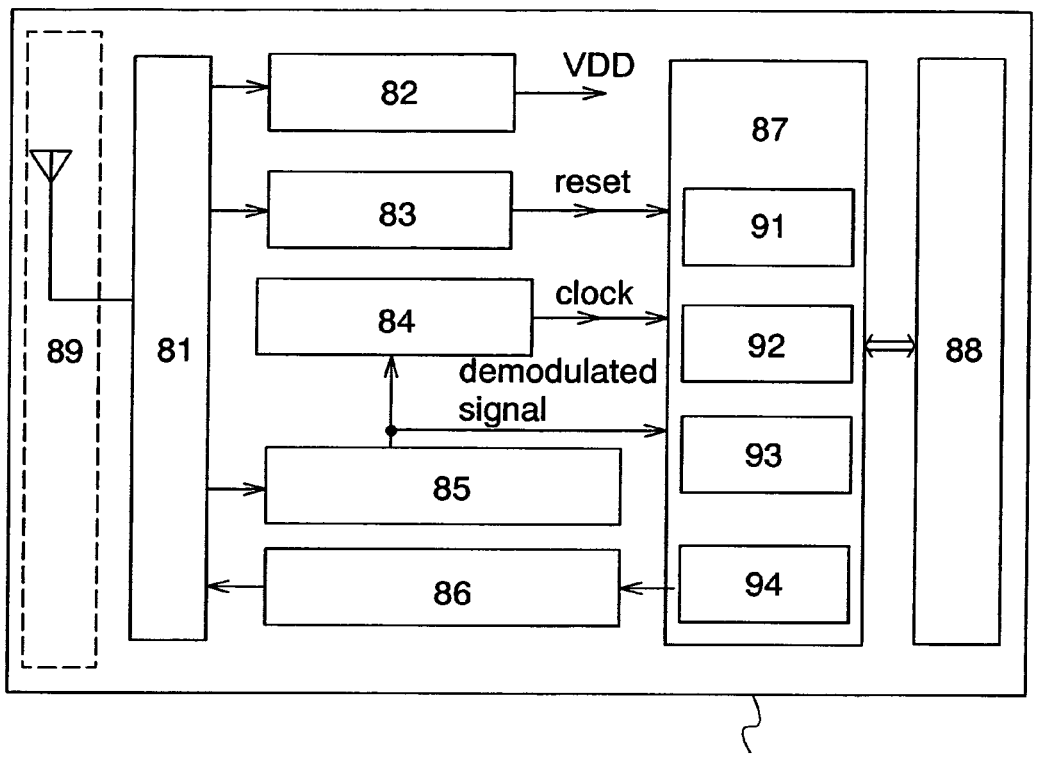
FIGS. 10A to 10C are a diagram and views each showing an example of an application mode of a semiconductor device of the present invention.

A semiconductor device 80 has the function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 10A). The high frequency circuit 81 is a circuit which receives a signal from the antenna 89 and outputs a signal received by the data modulation circuit 86 from the antenna 89. The power supply circuit 82 is a circuit which generates power supply potential from the received signal. The reset circuit 83 is a circuit which generates a reset signal. The clock generation circuit 84 is a circuit which generates various clock signals based on the received signal inputted from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are provided, for example. Note that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC circuit is a circuit which detects the presence or absence of a transmission error or the like based on the determined code.

In addition, the number of memory circuits to be provided is not limited to one, and may be plural. An SRAM, a flash memory, a ROM, a FeRAM, or the like, or a circuit using the organic compound layer described in the above embodiment mode in a memory element portion can be used.

Then, an example of operation of a semiconductor device which can communicate data without contact of the present invention will be explained. First, a radio signal is received by the antenna 89. The radio signal is transmitted to the power supply circuit 82 via the high frequency circuit 81, and high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Further, a signal transmitted through the reset circuit 83 and the clock generation circuit 84 via the high frequency circuit 81 and the demodulated signal are transmitted to the control circuit 87. The signal transmitted to the control circuit 87 is analyzed by the code extraction circuit 91, the code determination circuit 92, the CRC assessment circuit 93, and the like. Then, in accordance with the analyzed signal, information of the semiconductor device stored in the memory circuit 88 is outputted. The outputted information of the semiconductor device is encoded through the output unit circuit 94. Furthermore, the encoded information of the semiconductor device 80 is transmitted by the antenna 89 as a radio signal through the data modulation circuit 86. Note that low power supply potential (hereinafter, VSS) is common among a plurality of circuits included in the semiconductor device 80, and VSS can be set to GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (battery) mounted, or by an electromagnetic wave and a power source (battery) with the power source (battery) mounted.

Since a semiconductor device which can be bent can be manufactured by using the structure shown in the above embodiment mode, the semiconductor device can be provided over an object having a curved surface by attachment.

Figure 10B:
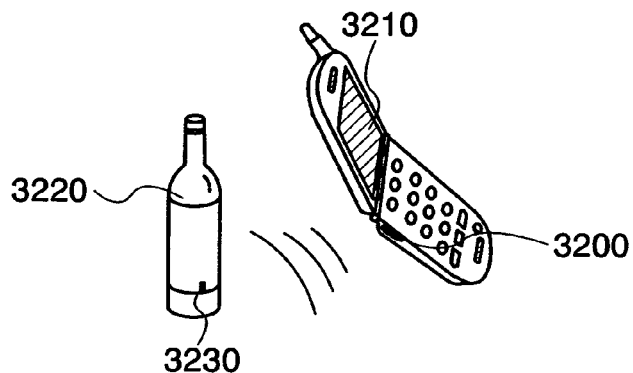
Figure 10C:
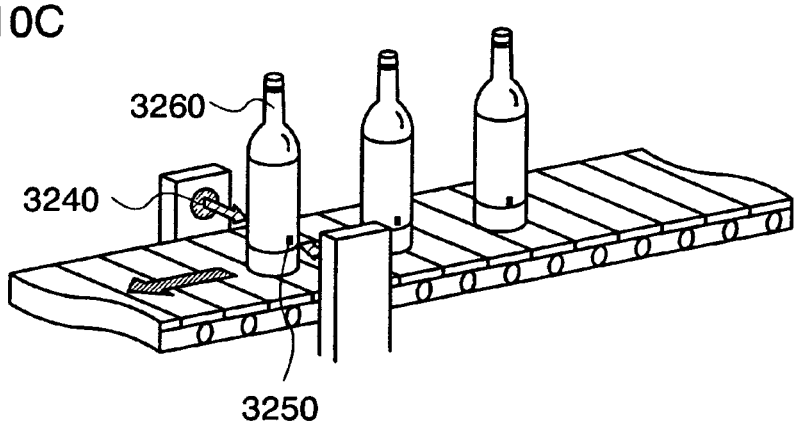

Next, an example of application modes of a semiconductor device which can exchange data without contact will be explained. A side face of a portable terminal including a display portion 3210 is provided with a reader/writer 3200, and a side face of an article 3220 is provided with a semiconductor device 3230 (FIG. 10B). When the reader/writer 3200 is held over the semiconductor device 3230 included in the article 3220, information on the article 3220 such as a raw material, the place of origin, an inspection result in each production process, the history of distribution, or an explanation of the article is displayed on the display portion 3210. In addition, when a product 3260 is transported by a conveyor belt, the product 3260 can be inspected using a reader/writer 3240 and a semiconductor device 3250 provided over the product 3260 (FIG. 10C). Thus, by utilizing the semiconductor device for a system, information can be acquired easily, and improvement in functionality and added value of the system can be achieved. As shown in the above embodiment mode, a transistor or the like included in a semiconductor device can be prevented from being damaged even when the semiconductor device is attached to an object having a curved surface, and a reliable semiconductor device can be provided.

In addition, as a signal transmission method in the above semiconductor device which can exchange data without contact, an electromagnetic coupling method, an electromagnetic induction method, a microwave method, or the like can be used. The transmission system may be appropriately selected by a practitioner in consideration of an intended use, and an optimum antenna may be provided in accordance with the transmission method.

In a case of employing, for example, an electromagnetic coupling method or an electromagnetic induction method (for example, a 13.56 MHz band) as the signal transmission method in the semiconductor device, electromagnetic induction is caused by a change in magnetic field density. Therefore, the conductive film serving as the antenna is formed in an annular shape (for example, a loop antenna) or a spiral shape (for example, a spiral antenna).

Figure 12A:
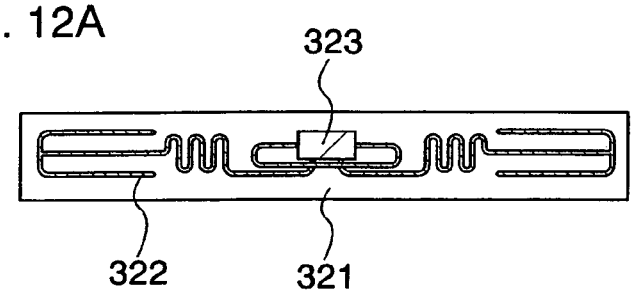
FIGS. 12A to 12D are views each showing an example of an application mode of a semiconductor device of the present invention.
Figure 12B:
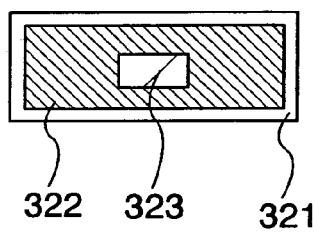
Figure 12C:
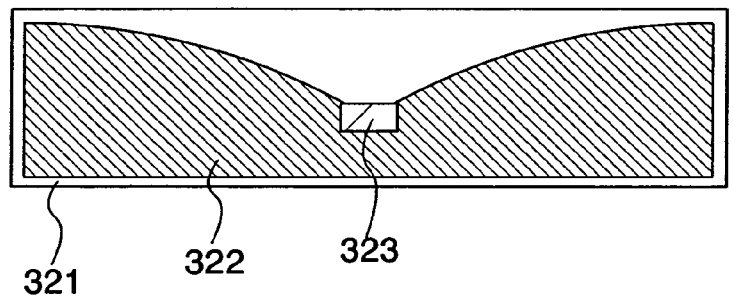
Figure 12D:
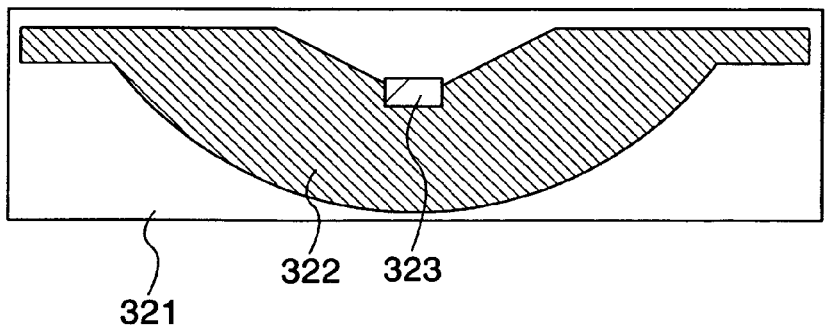

In a case of employing, for example, a microwave method (for example, a UHF band (860 to 960 MHz band), a 2.45 GHz band, or the like) as the signal transmission method in the semiconductor device, the shape such as a length of the conductive film serving as an antenna may be appropriately set in consideration of a wavelength of an electromagnetic wave used for signal transmission. For example, the conductive film serving as an antenna can be formed in a linear shape (for example, a dipole antenna (FIG. 12A)), a flat shape (for example, a patch antenna (FIG. 12B)), a ribbon shape (FIGS. 12C and 12D), or the like. The shape of the conductive film serving as an antenna is not limited to a linear shape, and the conductive film serving as an antenna may be provided in a curved-line shape, a meander shape, or a combination thereof, in consideration of a wavelength of an electromagnetic wave.

The conductive film serving as an antenna is formed with a conductive material by a CVD method, a sputtering method, a printing method such as screen printing or gravure printing, a droplet discharging method, a dispenser method, a plating method, or the like. The conductive material is formed with a single-layer structure of an element of aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing these elements as its main component; or a stacked structure thereof.

In a case of forming a conductive film serving as an antenna by, for example, a screen printing method, the conductive film can be provided by selectively printing conductive paste in which conductive particles each having a grain size of several nm to several tens of μm are dissolved or dispersed in an organic resin. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti), fine particles of silver halide, or dispersible nanoparticles can be used. In addition, as the organic resin included in the conductive paste, one or a plurality of organic resins each serving as a binder, a solvent, a dispersant, or a coating of the metal particle can be used. Typically, an organic resin such as an epoxy resin or a silicon resin can be used. In forming a conductive film, baking is preferably performed after the conductive paste is applied. For example, in a case of using fine particles (the grain size of which is 1 to 100 nm) containing silver as its main component as a material of the conductive paste, a conductive film can be obtained by curing the conductive paste by baking at temperatures of 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above material, ceramic, ferrite, or the like may be applied to an antenna. Further, a material of which dielectric constant and magnetic permeability are negative in a microwave band (metamaterial) can be applied to an antenna.

In a case of applying an electromagnetic coupling method or an electromagnetic induction method, and providing a semiconductor device including an antenna in contact with metal, a magnetic material having magnetic permeability is preferably provided between the semiconductor device and metal. In the case of providing a semiconductor device including an antenna in contact with metal, an eddy current flows in metal accompanying change in magnetic field, and a demagnetizing field generated by the eddy current impairs a change in magnetic field and decreases a communication distance. Therefore, an eddy current of metal and a decrease in communication range can be suppressed by providing a material having magnetic permeability between the semiconductor device and metal. Note that ferrite or a metal thin film having high magnetic permeability and little loss of high frequency wave can be used as the magnetic material.

In a case of providing an antenna, a semiconductor element such as a transistor and a conductive film serving as an antenna may be directly formed over one substrate, or a semiconductor element and a conductive film serving as an antenna may be provided over separate substrates and then attached to be electrically connected to each other.

Note that an applicable range of the flexible semiconductor device is wide in addition to the above, and the flexible semiconductor device can be applied to any product as long as it clarifies information such as the history of an object without contact and is useful for production, management, or the like. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples thereof will be explained with reference to FIGS. 11A to 11H.

Figure 11A:
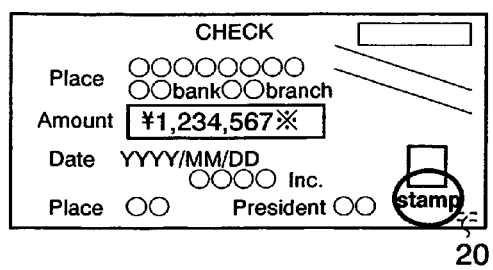
FIGS. 11A to 11H are views each showing an example of an application mode of a semiconductor device of the present invention.
Figure 11B:
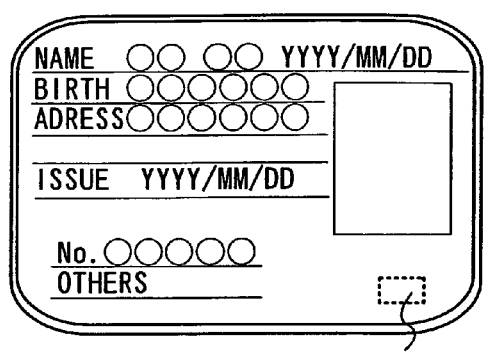
Figure 11C:
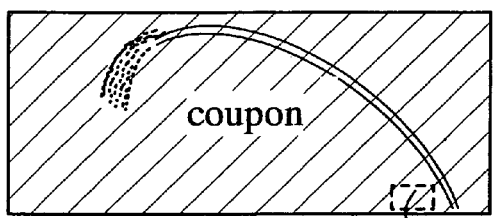
Figure 11D:
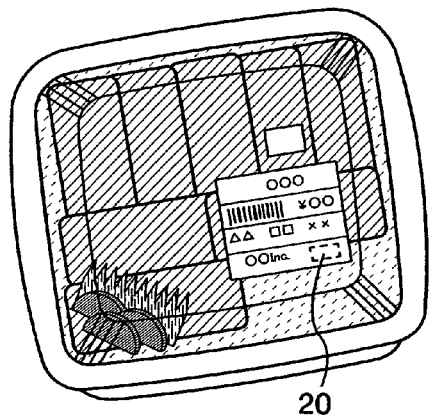
Figure 11E:
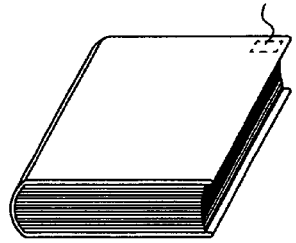
Figure 11F:
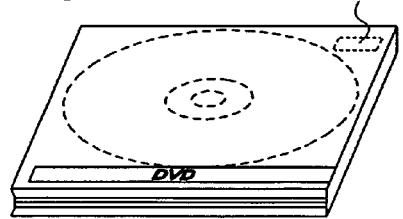
Figure 11G:
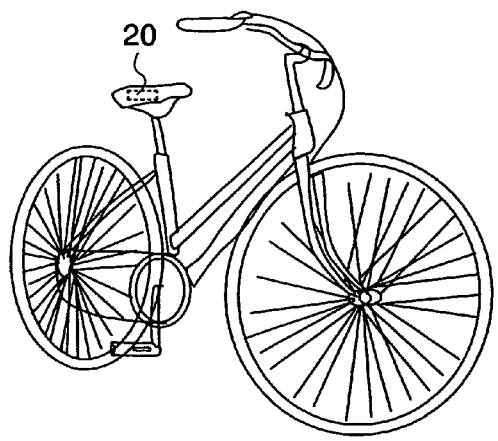
Figure 11H:
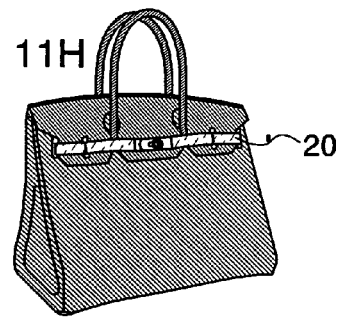

The paper money and coins are money distributed to the market and include one valid in a certain area (cash voucher), memorial coins, and the like. The securities refer to checks, certificates, promissory notes, and the like (FIG. 11A). The certificates refer to driver's licenses, certificates of residence, and the like (FIG. 11B). The bearer bonds refer to stamps, rice coupons, various gift certificates, and the like (FIG. 11C). The packing containers refer to wrapping paper for food containers and the like, plastic bottles, and the like (FIG. 11D). The books refer to hardbacks, paperbacks, and the like (FIG. 11E). The recording media refers to DVD software, video tapes, and the like (FIG. 11F). The vehicles refer to wheeled vehicles such as bicycles, ships, and the like (FIG. 11G). The personal belongings refer to bags, glasses, and the like (FIG. 11H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to a liquid crystal display device, an EL display device, a television device (a TV set and a flat-screen TV set), a cellular phone, and the like.

Forgery can be prevented by providing the paper money, the coins, the securities, the certificates, the bearer bonds, or the like with the semiconductor device. The efficiency of an inspection system, a system used in a rental shop, or the like can be improved by providing the packing containers, the books, the recording media, the personal belongings, the food, the commodities, the electronic devices, or the like with the semiconductor device. Forgery or theft can be prevented by providing the vehicles, the health products, the medicine, or the like with the semiconductor device; further, in a case of the medicine, medicine can be prevented from being taken mistakenly. The semiconductor device can be mounted on the foregoing article by being attached to the surface or being embedded therein. For example, in a case of a book, the semiconductor device may be embedded in a piece of paper; in a case of a package made from an organic resin, the semiconductor device may be embedded in the organic resin. By using a flexible semiconductor device, breakage or the like of an element included in the semiconductor device can be prevented even when the semiconductor device is mounted on paper or the like.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. Moreover, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Note that this embodiment mode can be implemented by being arbitrarily combined with the above embodiment mode. In other words, the material or the formation method described in the above embodiment mode can be used in combination also in this embodiment mode, and the material or the formation method described in this embodiment mode can be used in combination also in the above embodiment mode.

Embodiment Mode 4

This embodiment mode will explain an example of application modes of a semiconductor device that is obtained by using the manufacturing method described in the above embodiment mode. Specifically, a semiconductor device having a displaying means will be explained with reference to drawings.

First, as a displaying means, a case of providing a pixel portion with a light-emitting element will be explained with reference to FIGS. 13A and 13B. Note that FIG. 13A shows a top view showing an example of a semiconductor device of the present invention, whereas FIG. 13B shows a cross-sectional view of FIG. 13A taken along lines a-b and c-d.

As shown in FIG. 13A, a semiconductor device shown in this embodiment mode includes a scanning line driver circuit 502, a signal line driver circuit 503, a pixel portion 504, and the like which are provided over a film 225 (a film-like substrate). In addition, a film 222 (a film-like substrate) is provided so as to sandwich the pixel portion 504 with the film 225. The scanning line driver circuit 502, the signal line driver circuit 503, and the pixel portion 504 can be provided by forming thin film transistors each having any of the structures shown in the above embodiment mode over the film 225.

The scanning line driver circuit 502 and the signal line driver circuit 503 receive a video signal, a clock signal, a start signal, a reset signal, or the like from an FPC (Flexible Printed Circuit) 507 serving as an external input terminal. Note that only the FPC is shown here; however, the FPC may be provided with a printed wiring board. In addition, as a thin film transistor, which forms the signal line driver circuit 503 or the scanning line driver circuit 502, a structure where thin film transistors are stacked can be employed as shown in the above embodiment mode. By providing thin film transistors by being stacked, an area in which the signal line driver circuit 503 or the scanning line driver circuit 502 is occupied can be reduced; therefore, the pixel portion 504 can be formed to have a large area.

FIG. 13B is a schematic view of a cross section in FIG. 13A taken along lines a-b and c-d. Here, a case where thin film transistors included in the signal line driver circuit 503 and the pixel portion 504 are provided over the film 225 is shown. A CMOS circuit that is a combination of an n-type thin film transistor 510a and a p-type thin film transistor 510b having any of the structure shown in the above embodiment mode is formed as the signal line driver circuit 503.

A thin film transistor that forms a driver circuit such as the scanning line driver circuit 502 or the signal line driver circuit 503 may be formed using a CMOS circuit, a PMOS circuit, or an NMOS circuit. A driver integration type in which a driver circuit such as the scanning line driver circuit 502 or the signal line driver circuit 503 is formed over the film 225 is described in this embodiment mode; however, it is not necessarily required, and a driver circuit can be formed outside the film 225 instead of over the film 225.

The pixel portion 504 is formed with a plurality of pixels each including a light-emitting element 516 and a thin film transistor 511 for driving the light-emitting element 516. A thin film transistor having any of the structures shown in the above embodiment mode can be applied to the thin film transistor 511. Here, a first electrode 513 is provided so as to be connected to a conductive film 214 connected to a source or drain region of the thin film transistor 511, and an insulating film 217 is formed to cover an end portion of the first electrode 513. The insulating film 217 serves as a partition in a plurality of pixels.

As the insulating film 217, a positive type photosensitive acrylic resin film is used here. The insulating film 217 is formed to have a curved surface at an upper end portion or a lower end portion thereof in order to make the coverage favorable. For example, in a case of using positive type photosensitive acrylic as a material of the insulating film 217, the insulating film 217 is preferably formed to have a curved surface with a curvature radius (0.2 to 3 μm) only at an upper end portion. Either a negative type which becomes insoluble in an etchant by light irradiation or a positive type which becomes soluble in an etchant by light irradiation can be used as the insulating film 217. Alternatively, the insulating film 217 can be provided with a single-layer structure of an organic material such as epoxy, polyimide, polyamide, polyvinylphenol, or benzocyclobutene, or a siloxane resin; or a stacked structure thereof. As shown in the above embodiment mode, the surface of the insulating film 217 can be modified to obtain a dense film by subjecting the insulating film 217 to plasma treatment and oxidizing or nitriding the insulating film 217. By modifying the surface of the insulating film 217, intensity of the insulating film 217 can be improved, and physical damage such as crack generation at the time of forming an opening or the like or film reduction at the time of etching can be reduced. In addition, by modifying the surface of the insulating film 217, interfacial quality such as adhesion with a light-emitting layer 514 to be provided over the insulating film 217 is improved.

In addition, in the semiconductor device shown in FIGS. 13A and 13B, the light-emitting layer 514 is formed over the first electrode 513, and a second electrode 515 is formed over the light-emitting layer 514. The light-emitting element 516 is provided with a stacked structure of the first electrode 513, the light-emitting layer 514, and the second electrode 515.

One of the first electrode 513 and the second electrode 515 is used as an anode, and the other is used as a cathode.

A material having a high work function is preferably used for an anode. For example, a single-layer film such as an ITO film, an indium tin oxide film containing silicon, a transparent conductive film formed by a sputtering method using a target in which indium oxide is mixed with zinc oxide (ZnO) of 2 to 20 wt %, a zinc oxide (ZnO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and another titanium nitride film; or the like can be used. When a stacked structure is employed, the electrode can have low resistance as a wiring and form a favorable ohmic contact. Further, the electrode can serve as an anode.

A material having a low work function (Al, Ag, Li, Ca, or an alloy thereof such as MgAg, MgIn, AlLi, $CaF_2$, or $Ca_3N_2$) is preferably used for a cathode. In a case where an electrode used as a cathode is made to transmit light, a stacked layer of a metal thin film with a small thickness and a transparent conductive film (ITO, indium tin oxide containing silicon, a transparent conductive film formed by a sputtering method using a target in which indium oxide is mixed with zinc oxide (ZnO) of 2 to 20 wt %, zinc oxide (ZnO), or the like) is preferably used as the electrode.

Here, the first electrode 513 is formed using ITO which has a light-transmitting property as an anode, and light is extracted from the film 225 side. Note that light may be extracted form the film 222 side by using a material having a light-transmitting property for the second electrode 515, or light can be extracted from both the film 225 side and the film 222 side by forming the first electrode 513 and the second electrode 515 with a material having a light-transmitting property (this structure is referred to as dual emission).

The light-emitting layer 514 can be formed with a single layer or a stacked structure of a low molecular material, an intermediate molecular material (including an oligomer and a dendrimer), or a high molecular material (also referred to as a polymer) by a method such as a vapor deposition method using an evaporation mask, an ink-jet method, or a spin coating method.

Note that the semiconductor device including a pixel portion is not limited to the above structure using a light-emitting element in a pixel portion as described above, and it also includes a semiconductor device using liquid crystals in a pixel portion. The semiconductor device using liquid crystals in a pixel portion is shown in FIG. 14.

Figure 14:
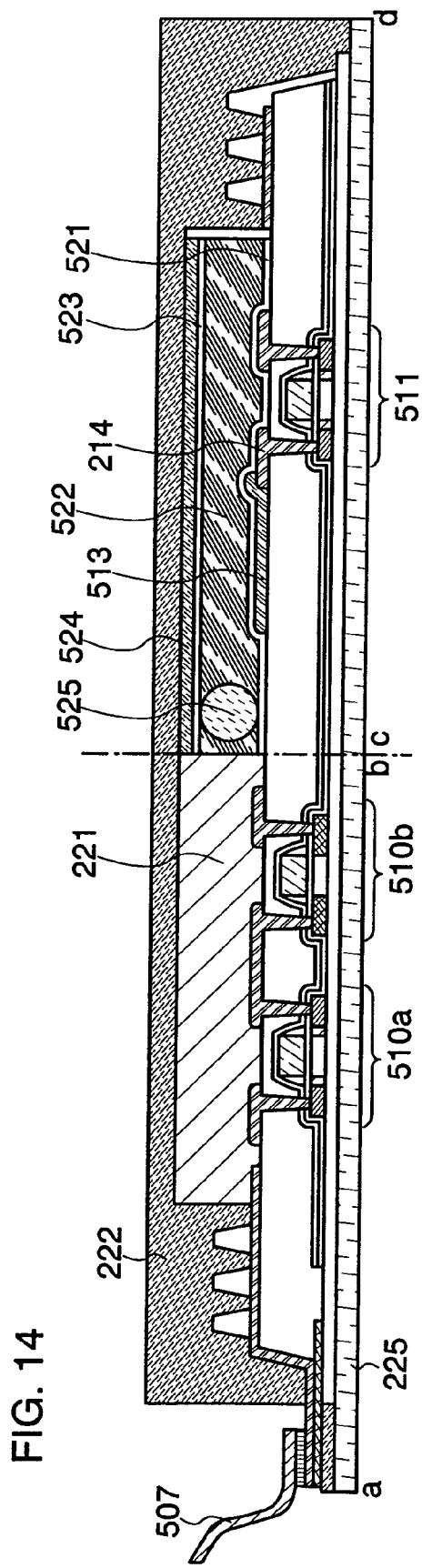
FIG. 14 is a view showing an example of an application mode of a semiconductor device of the present invention.

FIG. 14 shows one example of a semiconductor device having liquid crystals in a pixel portion. Liquid crystals 522 are provided between an orientation film 521 provided to cover a conductive film 214 and a first electrode 513 and an orientation film 523 provided over a film 222. In addition, a second electrode 524 is provided to be in contact with the film 222. An image is displayed by controlling light transmittance by controlling a voltage applied to the liquid crystals provided between the first electrode 513 and the second electrode 524. Moreover, a spacer 525 is provided in the liquid crystals 522 to control the distance (cell gap) between the first electrode 513 and the second electrode 524.

As described above, in the semiconductor device described in this embodiment mode, the pixel portion can be provided with a light-emitting element or liquid crystals.

Next, application modes of a semiconductor device having the above pixel portion will be explained with reference to drawings.

The following electronic devices can be given as application modes of a semiconductor device having the above pixel portion: a camera such as a video camera or a digital camera, a goggle type display (head mounted display), a navigation system, an audio reproducing device (car audio, an audio component, and the like), a computer, a game machine, a portable information terminal (a mobile computer, a cellular phone, a portable game machine, an electronic book, and the like), an image reproducing device provided with a recording medium (specifically, a device capable of processing data in a recording medium such as a digital versatile disc (DVD) and having a display which can display the image of the data), and the like. Hereinafter, specific examples thereof will be described.

Figure 15A:
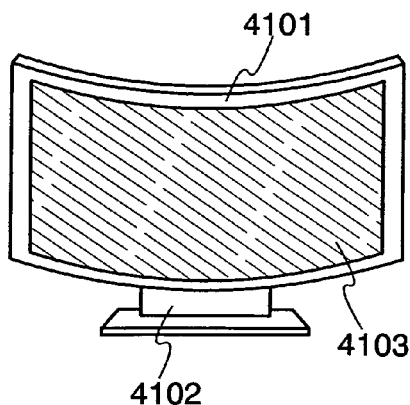
FIGS. 15A to 15F are views each showing an example of an application mode of a semiconductor device of the present invention.

FIG. 15A shows a display, which includes a main body 4101, a supporting stand 4102, a display portion 4103, and the like. The display portion 4103 is formed using a flexible substrate, which can realize a lightweight and thin display. In addition, the display portion 4103 can be curved, and can be detached from the support 4102 and the display can be mounted along a curved wall. Thus, the flexible display can be provided over a curved portion as well as a flat surface; therefore, it can be used for various applications. A flexible display, which is one application mode of a semiconductor device of the present invention, can be manufactured by using the flexible semiconductor device described in this embodiment mode or the above embodiment mode for the display portion 4103, a circuit, or the like.

Figure 15B:
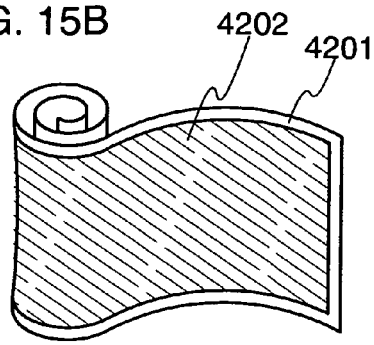

FIG. 15B shows a display that can be wound, which includes a main body 4201, a display portion 4202, and the like. Since the main body 4201 and the display portion 4202 are formed using a flexible substrate, the display can be carried in a bent or wound state. Therefore, even in a case where the display is large-size, the display can be carried in a bag in a bent or wound state. A flexible, lightweight, and thin large-sized display, which is one application mode of a semiconductor device of the present invention, can be manufactured by using the flexible semiconductor device shown in this embodiment mode or the above embodiment mode for the display portion 4202, a circuit, or the like.

Figure 15C:
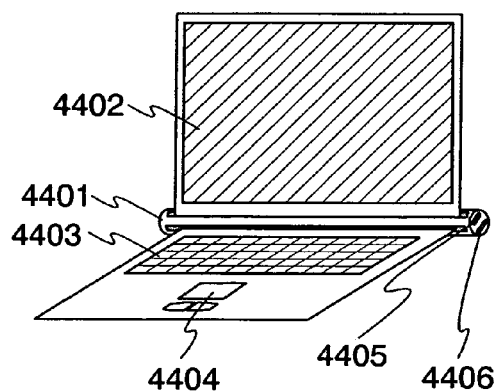

FIG. 15C shows a sheet-type computer, which includes a main body 4401, a display portion 4402, a keyboard 4403, a touch pad 4404, an external connection port 4405, a power plug 4406, and the like. The display portion 4402 is formed using a flexible substrate, which can realize a lightweight and thin computer. In addition, the display portion 4402 can be wound and stored in the main body by providing a portion of the main body 4401 with a storage space. Moreover, also by forming the keyboard 4403 to be flexible, the keyboard 4403 can be wound and stored in the storage space of the main body 4401 in a similar manner to the display portion 4402, which is convenient for carrying around. The computer can be stored without taking a place by bending when it is not used. A flexible, lightweight, and thin computer, which is one application mode of a semiconductor device of the present invention, can be manufactured by using the flexible semiconductor device shown in this embodiment mode or the above embodiment mode for the display portion 4402, a circuit, or the like.

Figure 15D:
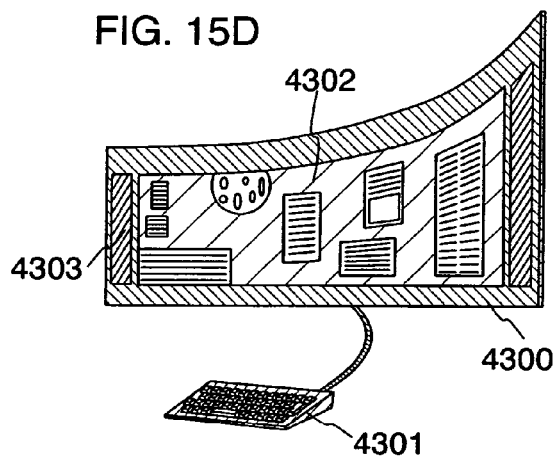

FIG. 15D shows a display device having a 20 to 80-inch large-sized display portion, which includes a main body 4300, a keyboard 4301 that is an operation portion, a display portion 4302, a speaker 4303, and the like. The display portion 4302 is formed using a flexible substrate, and the main body 4300 can be carried in a bent or wound state with the keyboard 4301 detached. In addition, the connection between the keyboard 4301 and the display portion 4302 can be performed without wires. For example, the main body 4300 can be mounted along a curved wall and can be operated with the key board 4301 without wires. In this case, a flexible, light-weight, and thin large-sized display device, which is one application mode of a semiconductor device of the present invention, can be manufactured by using the flexible semiconductor device shown in this embodiment mode or the above embodiment mode for the display portion 4302, a circuit, or the like.

Figure 15E:
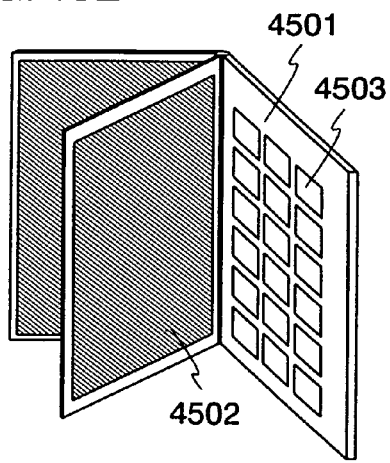

FIG. 15E shows an electronic book, which includes a main body 4501, a display portion 4502, operation keys 4503, and the like. In addition, a modem may be incorporated in the main body 4501. The display portion 4502 is formed using a flexible substrate and can be bent or wound. Therefore, the electronic book can also be carried without taking a place. Further, the display portion 4502 can display a moving image as well as a still image such as a character. A flexible, lightweight, and thin electronic book, which is one application mode of a semiconductor device of the present invention, can be manufactured by using the flexible semiconductor device shown in this embodiment mode or the above embodiment mode for the display portion 4502, a circuit, or the like.

Figure 15F:
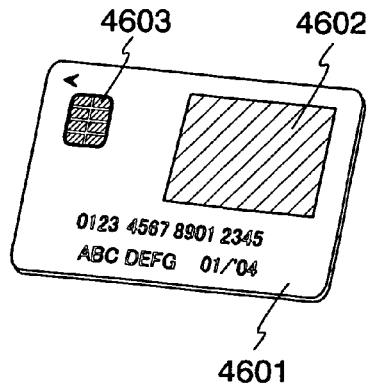

FIG. 15F shows an IC card, which includes a main body 4601, a display portion 4602, a connection terminal 4603, and the like. Since the display portion 4602 is formed to be a lightweight and thin sheet type using a flexible substrate, it can be formed over a card surface by attachment. When the IC card can receive data without contact, information obtained from the outside can be displayed on the display portion 4602. A flexible, lightweight, and thin IC card, which is one application mode of a semiconductor device of the present invention, can be manufactured by using the flexible semiconductor device shown in this embodiment mode or the above embodiment mode for the display portion 4602, a circuit, or the like.

As described above, an applicable range of a semiconductor device of the present invention is so wide that the semiconductor device of the present invention can be applied to electronic devices of various fields. Note that this embodiment mode can be implemented by being arbitrarily combined with the above embodiment mode. In other words, the material or the formation method described in the above embodiment mode can be used in combination also in this embodiment mode, and the material or the formation method described in this embodiment mode can be used in combination also in the above embodiment mode.

This application is based on Japanese Patent Application serial no. 2005-288141 filed in Japan Patent Office on Sep. 30 in 2005, the entire contents of which are hereby incorporated by reference.

EXPLANATION OF REFERENCE

101. substrate, 102. element group, 103. insulating film, 104. opening, 105. film, 106. substrate, 107. means for thinning a film, 108. chemical solution, 109. film, 110. element formation layer, 111. crack, 201. substrate, 202. insulating film, 203. semiconductor film, 203*a*, semiconductor film, 203*b*, semiconductor film, 203*c*, semiconductor film, 203*d*, semiconductor film, 203*e*, semiconductor film, 203*f* semiconductor film, 204. gate insulating film, 205. gate electrode, 206. N-type impurity region, 207. P-type impurity region, 208. insulating film, 209*a*, first N-type impurity region, 209*b*, second N-type impurity region, 210. insulating film, 211. insulating film, 212. insulating film, 213. insulating film 214. conductive film, 215. insulating film, 216*a*, conductive film, 216*b*, conductive film, 216*c*, conductive film, 216*d*, conductive film, 217. insulating film, 218. conductive film, 219. organic compound layer, 220. conductive film, 221. insulating film, 222. film, 224. substrate, 225. film, 230*a*, thin film transistor, 230*b*, thin film transistor, 230*c*, thin film transistor, 230*d*, thin film transistor, 230*e*, thin film transistor, 230*f*, thin film transistor, 231*a*, memory element portion, 231*b*, memory element portion, 233. element formation layer, 241. stage, 243. roller, 80. semiconductor device, 81. high frequency circuit, 82. power supply circuit, 83. reset circuit, 84. clock generation circuit, 85. data demodulation circuit, 86. data modulation circuit, 87. control circuit, 88. memory circuit, 89. antenna, 91. code extraction circuit, 92. code determination circuit, 93. CRC determination circuit, 94. output unit circuit, 3210. display portion, 3200. reader/writer, 3220. article, 3230. semiconductor device, 3240. reader/writer, 3250. semiconductor device, 3260. article, 502. scanning line driver circuit, 503. signal line driver circuit, 504. pixel portion, 510*a*, thin film transistor, 510*b*, thin film transistor, 511. thin film transistor, 513. first electrode, 514. light-emitting layer, 515. second electrode, 516. light-emitting element, 521. orientation film, 522. liquid crystal, 523. orientation film, 524. second electrode, 525. spacer, 4101. main body, 4102. supporting stand, 4103. display portion, 4201. main body, 4202. display portion, 4401. main body, 4402. display portion, 4403. keyboard, 4404. touch pad, 4405. external connection port, 4406. power plug, 4300. main body, 4301. keyboard, 4302. display portion, 4303. speaker, 4501. main body, 4502. display portion, 4503. operation keys, 4601. main body, 4602. display portion, and 4603. connection terminal.

The invention claimed is:

1. A semiconductor device comprising:
    a first insulating film;
    an element group over the first insulating film, the element group containing a thin film transistor interposed between a plurality of insulating films and an antenna electrically connected to the thin film transistor;
    a protective film covering the thin film transistor and the antenna; and
    a second insulating film covering a top surface and a side surface of the protective film,
    wherein each of the first insulating film and the second insulating film contains at least one of polypropylene, polyester, vinyl, polyvinyl fluoride, polyvinyl chloride, and paper of a fibrous material.

2. A semiconductor device according to claim 1, wherein the semiconductor device is one of an RFID tag, an ID tag, an IC tag, an IC chip, an RF tag, a wireless tag, an electronic tag, and a wireless chip.

3. A semiconductor device according to claim 1, wherein the protective film contains a diamond-like-carbon.

4. A semiconductor device comprising:
    a first insulating film;
    an element group over the first insulating film, the element group containing a thin film transistor interposed between a plurality of insulating films and an antenna electrically connected to the thin film transistor;
    a protective film covering the thin film transistor and the antenna; and
    a second insulating film over the protective film, wherein a portion of the second insulating film is in contact with the first insulating film,
    wherein each of the first insulating film and the second insulating film contains at least one of polypropylene, polyester, vinyl, polyvinyl fluoride, polyvinyl chloride, and paper of a fibrous material.

5. A semiconductor device according to claim 4, wherein the semiconductor device is one of an RFID tag, an ID tag, an IC tag, an IC chip, an RF tag, a wireless tag, an electronic tag, and a wireless chip.

6. A semiconductor device according to claim 4, wherein the protective film contains a diamond-like-carbon.

7. A semiconductor device comprising:
    a first insulating film;
    an element group over the first insulating film, the element group containing a thin film transistor interposed between a plurality of insulating films and an antenna electrically connected to the thin film transistor;
    a protective film covering the thin film transistor and the antenna; and
    a second insulating film covering a top surface and a side surface of the protective film, wherein a side surface of the first insulating film is aligned with a side surface of the second insulating film,
    wherein each of the first insulating film and the second insulating film contains at least one of polypropylene, polyester, vinyl, polyvinyl fluoride, polyvinyl chloride, and paper of a fibrous material.

8. A semiconductor device according to claim 7, wherein the semiconductor device is one of an RFID tag, an ID tag, an IC tag, an IC chip, an RF tag, a wireless tag, an electronic tag, and a wireless chip.

9. A semiconductor device according to claim 7, wherein the protective film contains a diamond-like-carbon.

10. A semiconductor device comprising:
    a first insulating film;
    an element group over the first insulating film, the element group containing a thin film transistor interposed between a plurality of insulating films and an antenna electrically connected to the thin film transistor;
    a protective film covering the thin film transistor and the antenna; and
    a second insulating film over the protective film, wherein a portion of the second insulating film is in contact with the first insulating film, and wherein a side surface of the first insulating film is aligned with a side surface of the second insulating film,
    wherein each of the first insulating film and the second insulating film contains at least one of polypropylene, polyester, vinyl, polyvinyl fluoride, polyvinyl chloride, and paper of a fibrous material.

11. A semiconductor device according to claim 10, wherein the semiconductor device is one of an RFID tag, an ID tag, an IC tag, an IC chip, an RF tag, a wireless tag, an electronic tag, and a wireless chip.

12. A semiconductor device according to claim 10, wherein the protective film contains a diamond-like-carbon.

\* \* \* \* \*